United States Patent
Fujine et al.

(10) Patent No.: US 6,247,162 B1
(45) Date of Patent: Jun. 12, 2001

(54) METHOD AND APPARATUS FOR GENERATING LAYOUT DATA FOR A SEMICONDUCTOR INTEGRATED CIRCUIT DEVICE

(75) Inventors: Eiji Fujine; Takanori Nawa; Hiroshi Yuyama; Masahito Isoda, all of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/221,600

(22) Filed: Dec. 29, 1998

(30) Foreign Application Priority Data

Aug. 7, 1998 (JP) .................................................. 10-223814

(51) Int. Cl.$^7$ .................................................. G06F 17/50
(52) U.S. Cl. .................................................. 716/2
(58) Field of Search .................................................. 716/2

(56) References Cited

U.S. PATENT DOCUMENTS 5,598,348 * 1/1997 Rusu et al. ................................. 716/2
5,648,910 * 7/1997 Ito ........................................... 716/2

FOREIGN PATENT DOCUMENTS 2-188943   7/1990   (JP) .
4-107845   4/1992   (JP) .
2521041    5/1996   (JP) .

* cited by examiner

Primary Examiner—Trong Phan
(74) Attorney, Agent, or Firm—Armstrong, Westerman, Hattori, McLeland & Naughton, LLP

(57) ABSTRACT

A method and apparatus for generating external power wiring layout data for a semiconductor integrated circuit device determines an optimum layout without performing time consuming circuit simulation. An external power wiring supplies power to each of the functional blocks of the device. Design information is used to calculate a current consumption ratio for each power supply terminal of each functional block. Then, the current consumption for each power supply terminal is calculated using the calculated current consumption ratios. An external power wiring network is generated based on the calculated current consumption for each terminal. The generated external power wiring network is then analyzed and voltage and current values for each part of the network are calculated. Using the calculated voltage and current values, the wires are then optimally sized.

33 Claims, 16 Drawing Sheets

| Tr | GATE WIDTH | GATE LENGTH CORRELATION VALUE | OPERATING RATE | CURRENT CONSUMPTION RATE |
|---|---|---|---|---|
| Pa | 150 | 1 | 9 | 1350 |
| Pb | 110 | 2 | 12 | 2640 |
| Pc | 150 | 2 | 9 | 2700 |
| Na | 90 | 2 | 3 | 540 |
| Nb | 110 | 2 | 8 | 1760 |
| Nc | 110 | 2 | 0 | 0 |
| Nd | 110 | 1.3 | 10 | 1430 |

METHOD AND APPARATUS FOR GENERATING LAYOUT DATA FOR A SEMICONDUCTOR INTEGRATED CIRCUIT DEVICE

BACKGROUND OF THE INVENTION

The present invention generally relates to a method and apparatus for generating layout data, and more particularly, to a method and device for generating layout data for optimizing external power supply wirings to function blocks in a semiconductor integrated circuit device.

In a conventional process for determining the external power supply wirings to function blocks for a semiconductor integrated circuit device, an external power network for external power wirings is generated based on information about an internal power network of each function block and information about the current consumption of each power supply terminal of each function block. The external power network includes resistance elements, sampled from the external power wiring pattern and having predetermined resistance values, and current sources connected to nodes of the external power wirings and having predetermined current consumption values. The external power network is analyzed using a matrix expression, for example, and based on the analysis results, the width and the wiring path of the external power wirings connected to the power supply terminals of each function block are determined.

However, if information about the internal power network or information about the current consumption of each power supply terminal of the function block is not included in the function block library data, it is difficult to lay out the external power wiring having an optimum width. Accordingly, if information about the function block is insufficient, it is desirable to obtain the current consumption of each power supply terminal in order to lay out the external power wiring having the optimum width.

Circuit simulations are used to obtain the current consumption. First, resistance elements are sampled from the layout data of the function block based on a gate length, gate width, and the wiring length between the nodes of the internal power wirings, and an equivalent circuit is generated from the sampled resistance elements. Then, the electrical operation simulation of the equivalent circuit is carried out and based on the simulation result, the current consumption in each power supply terminal of the function block is obtained. Further, based on the current consumption, an external power network is generated, and the external power network is analyzed. Then, based on the analysis result, the layout of the external power wirings is determined. This method accurately determines the current consumption. However, the circuit simulation is time-consuming.

Another method involves setting the same current consumption ratio for all of the power supply terminals of the function block. Because this method generates the external power network based on a set current consumption ratio, no circuit simulation is required.

However, the current consumption for the power supply terminals usually varies according to the arrangement position of a transistor as a current source. Accordingly, differences in current consumption are not reflected in the analysis result of the external power network. As a result, the layout of the external power wirings is not optimized.

It is an object of the present invention to provide a method and apparatus for laying out an optimized external power wiring pattern in a short time.

SUMMARY OF THE INVENTION

Briefly stated, a method is provided for generating layout data of external power wirings that supply a power supply voltage to a plurality of power supply terminals in each block provided in a semiconductor integrated circuit device. First, design information of the semiconductor integrated circuit device is acquired. The design information includes external power wiring layout information, block layout information, and block current consumption values. Then, a current consumption ratio for each power supply terminal of each block is calculated using the block layout information. The current consumption for each power supply terminal is calculated using the corresponding calculated current consumption ratio and the block current consumption value. Then, an external power network of the external power wirings is generated using the external power wiring layout information. The external power network is analyzed to calculate voltage and current values for a plurality of parts of the external power wirings. Then, a structure of the external power wirings is generated in accordance with the calculated voltage and current values.

Another aspect of the present invention provides a recording medium having recorded thereon computer readable program code for generating layout data of external power wirings that supply a power supply voltage to a plurality of power supply terminals in each block. The program includes the steps of the above method.

Yet another aspect of the present invention provides an apparatus for generating layout data of external power wirings that supply a power supply voltage to a plurality of power supply terminals in each block. The apparatus includes a memory for storing design information of the semiconductor integrated circuit device including external power wiring layout information, block layout information, and block current consumption values. A processor is connected to the memory and executes layout processing. The processor operates to calculate a current consumption ratio for each power supply terminal of each block using the block layout information, calculate the current consumption for each power supply terminal using the corresponding calculated current consumption ratio and the block current consumption value, and generate an external power network of the external power wirings using the external power wiring layout information. The processor further operates to analyze the external power network to calculate voltage and current values for a plurality of parts of the external power wirings, and generate a structure of the external power wirings in accordance with the calculated voltage and current values.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS (First Embodiment)

Figure 1:
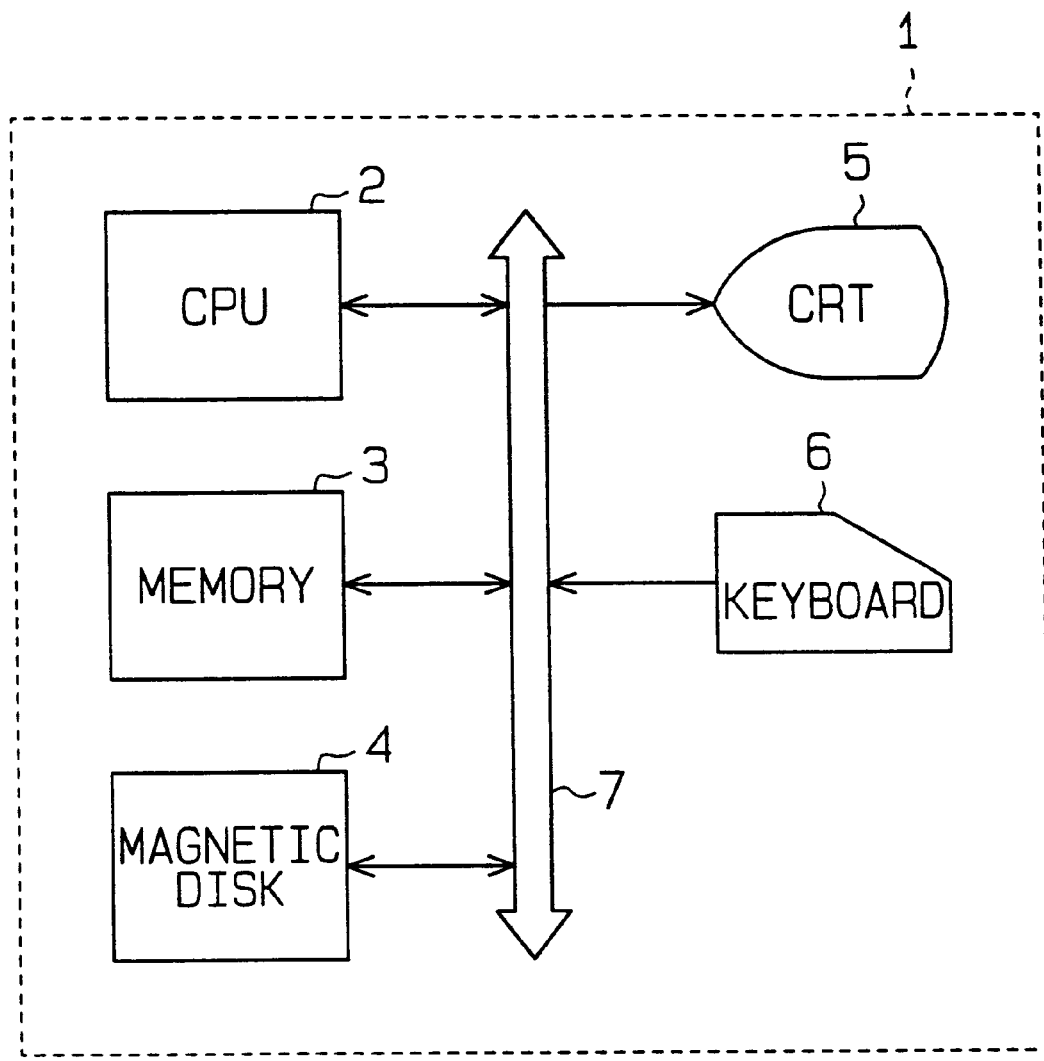
FIG. 1 is a schematic block diagram of a layout data generation apparatus according to a first embodiment of the present invention.

A method and apparatus for generating the layout data according to a first embodiment of the present invention are described below with reference to FIGS. 1 to 12. FIG. 1 is a schematic block diagram of a layout data generating apparatus 1. The layout data generating apparatus 1 is preferably a CAD (computer aided design) device, and comprises a central processing unit (CPU) 2, a memory 3, a magnetic disk 4, a display device 5, such as a CRT, and an input device, such as a keyboard (including a mouse) 6, which communicate with each other via a system bus 7. The CPU 2 operates in accordance with program data stored in the memory 3. The memory 3 stores various data required for executing the program, and processing results generated by the CPU 2. The keyboard 6 is used to enter data and commands required for the execution of the program or to input an instruction for outputting the processing result to the display device 5 and/or a printer (not illustrated).

Figure 2:
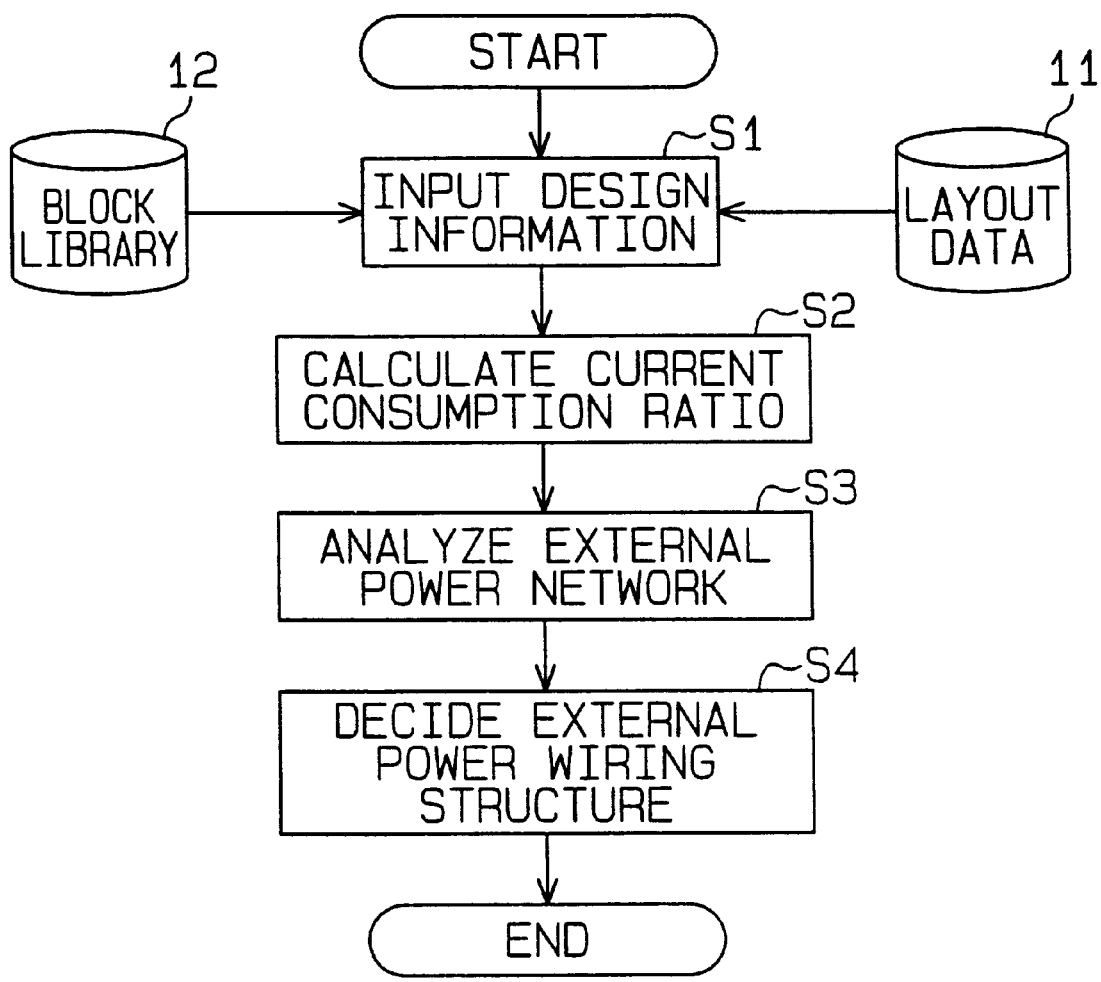
FIG. 2 is a flowchart illustrating schematic layout data generation processing according to a first embodiment of the present invention.

The magnetic disk 4 stores first and second files 11 and 12 shown in FIG. 2. The first file 11 includes layout data previously prepared during the floor plan processing of a semiconductor integrated circuit device. The layout data includes the layout data of plural function blocks and the layout data of external power wirings for supplying power to each function block. The external power supply wirings have a minimum width as determined in the design of a conventional semiconductor integrated circuit device. Using the minimum width prevents the redundancy of wiring width and minimizes the circuit area of the semiconductor integrated circuit device. The function block data includes the arrangement information and physical information of each block.

The second file 12 is a library containing the current consumption values of plural types of function blocks and the operating rate data of the transistors connected to the internal power wirings of the blocks. The current consumption values are determined based on the function of each block and the gate logical information using a predetermined power estimation method. Further, the current power values are determined according to the types of power (i.e., high potential power or low potential power) supplied to each function block. The function block data of the first file 11 may also be included in the second file library.

The CPU 2 starts the layout data generation processing program stored in the memory 3 in accordance with the operation of the keyboard 6 by an operator and executes steps S1 to S4 shown in FIG. 2. In step SI, the CPU 2 receives the design information required for the layout of the external power wirings from the first and second files 11 and 12. In other words, the CPU 2 receives the layout information of the external power wirings (or mother power wirings) and the arrangement information of each block from the first file 11 and receives the current consumption value of each block from the second file 12.

In step S2, the CPU 2 generates an external power network based on various types of information received in step 1. The CPU 2 receives the physical information from the first file 11 and calculates the current consumption ratio for each power supply terminal of each block based on the physical information. The physical information includes information about the type and size of transistors in the block, internal power wiring types, the arrangement position of the internal power wirings, and the position of the power supply terminals.

In step S3, the CPU 2 analyzes the external power network using a predetermined matrix operation. This analysis processing enables acquisition of the current values and voltage drop values in each node of the external power wiring.

In step S4, the CPU 2 compares the current values and voltage drop values with standard values and retrieves the incorrect portions of the external power wiring that do—not conform to the standard values. The CPU 2 then determines the structure of the external power wiring that corresponds to the incorrect portions based on the retrieval result and changes the width of the external power wiring stored in the first file 11 in accordance with the determined structure or adds wirings.

Figure 3:
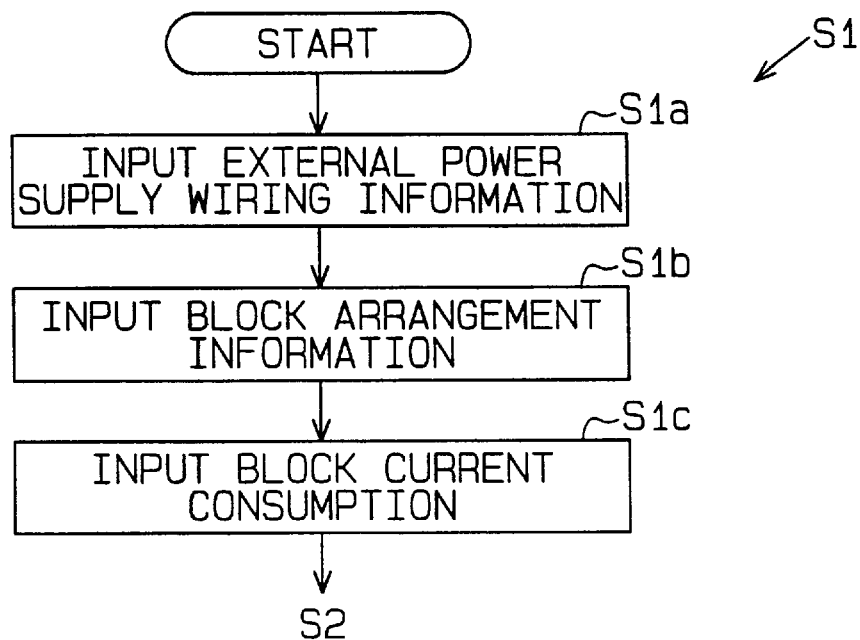
FIG. 3 is a flowchart illustrating design information input processing in the layout data generation processing of FIG. 2.

FIG. 3 is a flowchart illustrating substeps S1a to S1c of the design information input processing S1. In step S1a, the CPU 2 receives the layout information of the external power wirings (mother power wirings) from the first file 11. The layout information includes information about systems (high potential power supply and low potential power supply) of the external power supply voltage supplied via the external power wiring, the arrangement position of the external power wirings, and the wiring width.

In step S1b, the CPU 2 receives the arrangement information of each function block from the first file 11. The arrangement information includes information about the block types and block arrangement position. In step S1c, the CPU 2 further receives information from the second file 12 about the current consumption that corresponds to the block received in step S1b.

Figure 4:
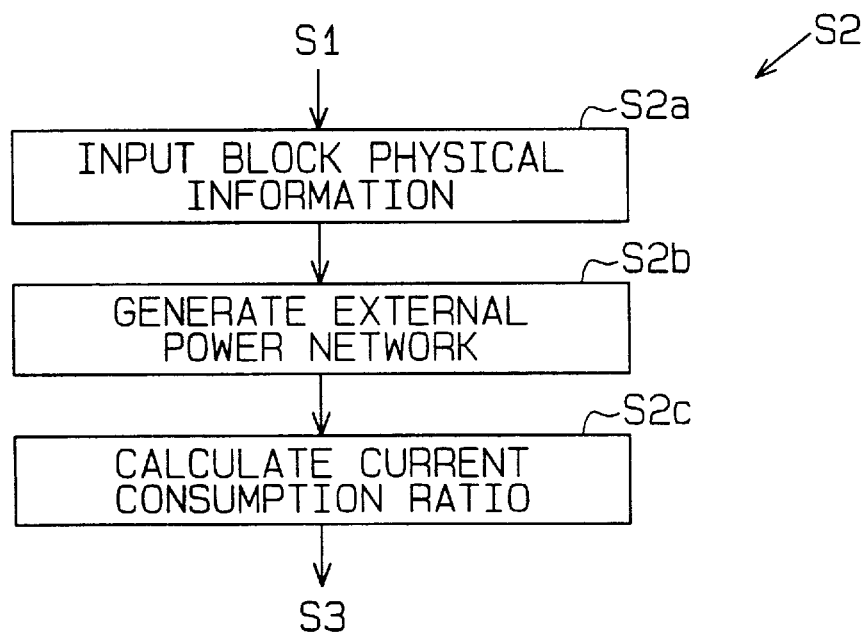
FIG. 4 is a flowchart illustrating the current consumption ratio calculation processing in the layout data generation processing of FIG. 2.

FIG. 4 is a flowchart illustrating substeps S2a to S2c of the current consumption ratio calculation processing step S2. In step S2a, the CPU 2 receives the block physical information from the first file 11.

In step S2b, the CPU 2 generates an external power network for the high potential power supply and an external power network for the low potential power supply based on the information received in step S1. The external power network comprises plural equivalent resistances for the external power wiring and plural current sources representing the current consumption in each power supply terminal of each block. The equivalent resistances have a resistance value based on a unit resistance value and the wiring width between the nodes, such as end points and intersections, of the external power wiring. The current that corresponds to the current consumption in each power supply terminal of each block flows in the current sources.

In step S2c, the CPU 2 calculates the current consumption ratio for the power supply terminal of each block based on the physical information of each block. The calculation of the current consumption ratio is described in more detail later. The current consumption ratio is set in accordance with the various power supply voltages supplied to each block. By calculating the current consumption ratio for each power supply terminal, the dispersion of the current consumption in each power supply terminal is considered. In other words, the dispersion of the current consumption in each power supply terminal is reflected in the analysis result of the power network. Accordingly, the CPU 2 lays out an optimum external power wiring based on the current consumption actually required by the function block.

Figure 5:
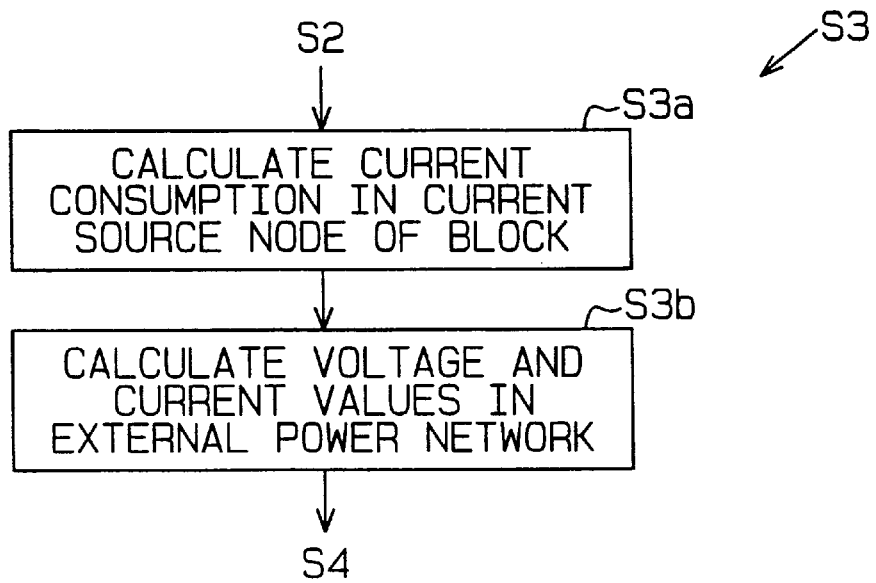
FIG. 5 is flowchart illustrating the power network analysis processing in the layout data generation processing of FIG. 2.

FIG. 5 is a flowchart illustrating substeps S3a and S3b of the power network analysis processing step S3. In step S3a, the CPU 2 calculates the current value at the nodes of the internal power wirings of each block. Specifically, the CPU 2 multiplies the total current consumption value of the function block by the current consumption ratio of each power supply terminal for every power voltage to generate the current consumption of each power supply terminal.

In step S3b, the CPU 2 analyzes the external power network based on the current consumption of each power supply terminal and calculates the voltage and current values in the external power network. Specifically, the CPU 2 carries out the predetermined matrix operation for the external power network and generates the current values applied to the equivalent resistances of the power network and the voltage values (voltage drops of the equivalent resistances) on both ends of each of the equivalent resistances.

Figure 6:
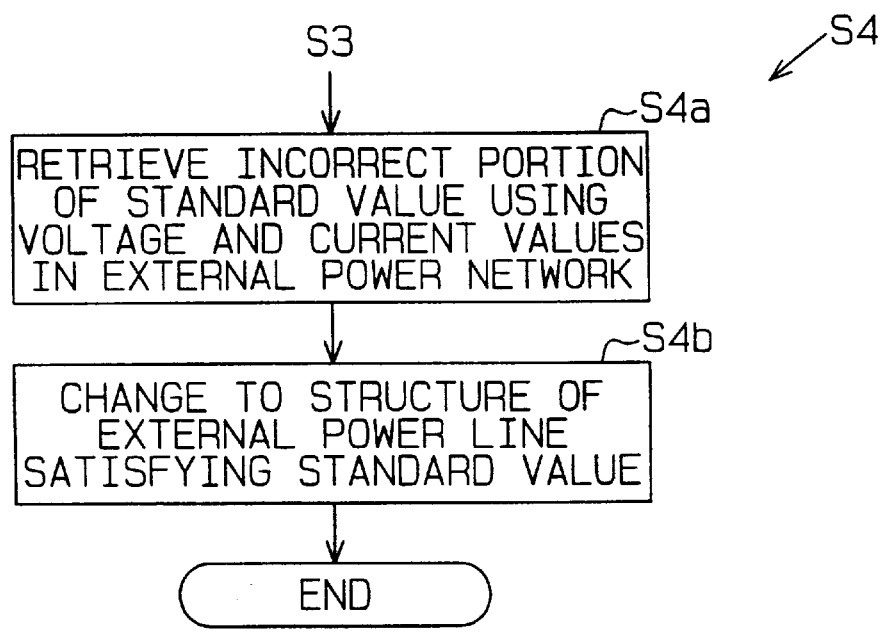
FIG. 6 is a flowchart illustrating the structural decision processing of external power wirings in the layout data generation processing of FIG. 2.

FIG. 6 is a flowchart illustrating substeps S4a and S4b of the power wiring structure decision processing step S4. In step S4a, the CPU 2 compares the predetermined standard values (reference voltage value and reference current value) and the voltage value and the current value obtained in step S3a, and based on the comparison result, retrieves the incorrect portions of the external power wiring. The standard values are previously set according to the wiring width of the external power wirings included in the preprocessing layout data stored in the first file 11.

In step S4b, the CPU 2 changes the structure of the external power wirings based on the incorrect portions of the external power wiring. The external power wirings are defined according to wiring width, film thickness, and the number of layers for forming the wiring. The CPU 2 changes at least one of the wiring width, film thickness, and the number of layers of the external power wiring in accordance with the actual voltage value and current value of each external power wiring based on the retrieval result.

For example, when the voltage value of the external power wiring is larger than the standard value, the width of the external power wiring is extended to the width that corresponds to the actual voltage value. Accordingly, the structure of an external power wiring that can supply the amount of current required for each block is obtained.

As another example, when the current density of a portion of the external power wiring exceeds a predetermined value, the CPU 2 extends the partial wiring width so that the current density of the portion of the external power wiring is below the predetermined value. When the current density of a portion of the external power wiring is below the predetermined value, the CPU 2 reduces the wiring width so that the current density of the portion of the external power wiring reaches the predetermined value.

Figure 7:
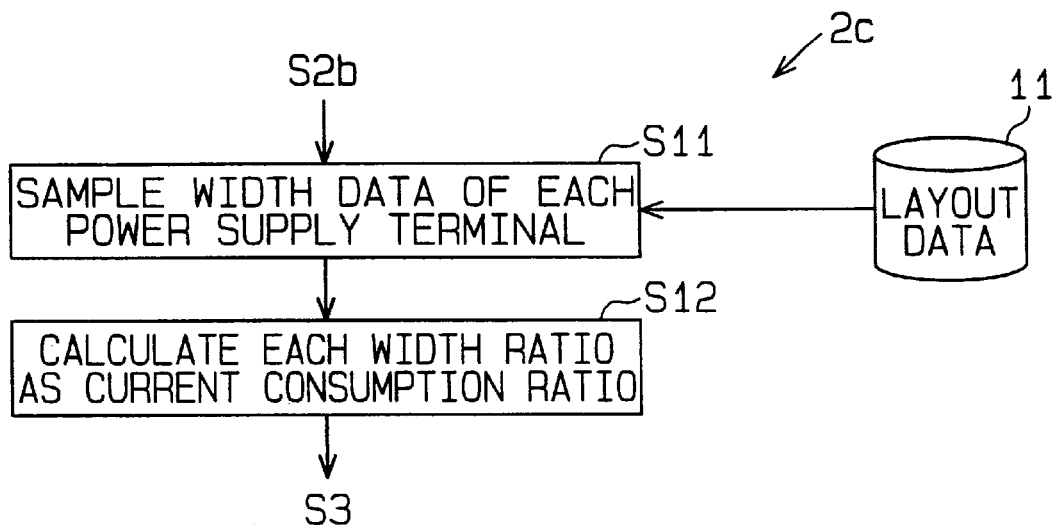
FIG. 7 is a flowchart illustrating the detailed current consumption ratio calculation processing according to the first embodiment of the present invention.

FIG. 7 is a flowchart illustrating substeps S11 and S12 of the current consumption ratio sampling processing step S2c. In step S11, the CPU 2 samples the width data of each power supply terminal in each block from the block layout data of the first file 11. Then, in step S12, the CPU 2 calculates the width ratio of each power supply terminal for the high potential power supply voltage Vdd and low potential power supply voltage Vss based on the width data of each power supply terminal. The ratio of this width is set as the current consumption ratio.

The block information stored in the first file 11 includes the data related to the operation and current consumption of each block. The power supply terminal of each block has the width that corresponds to the amount of current consumed by the current source, such as an intra-block transistor. In other words, each power supply terminal has a width that corresponds to the consumption level of the current supplied thereto.

Figure 8:
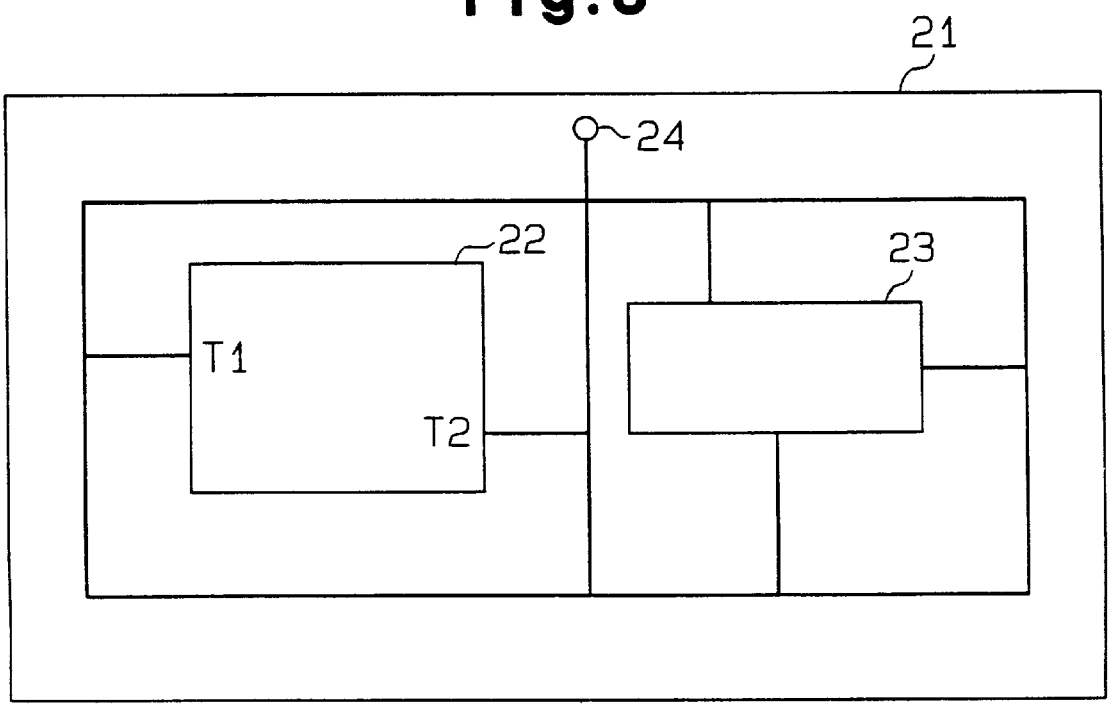
FIG. 8 is a schematic diagram of a semiconductor integrated circuit device having function blocks and external power wirings.
Figure 9:
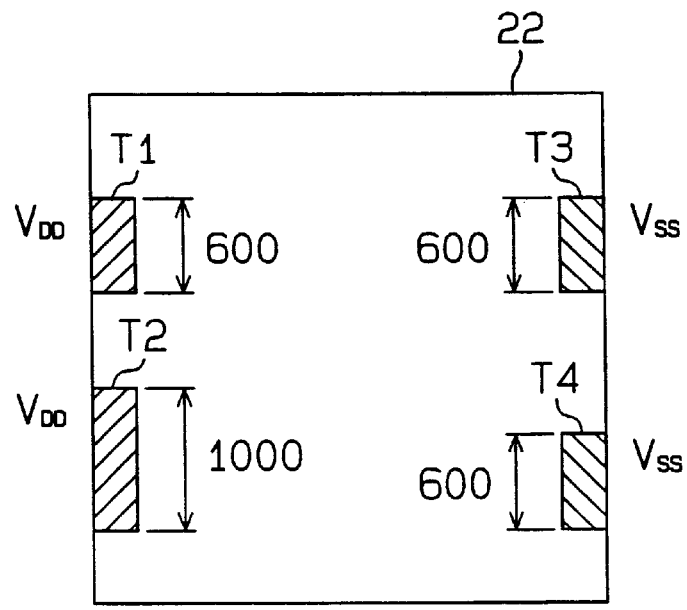
FIG. 9 is a block diagram illustrating intra-block power supply terminals.

As shown in FIG. 8, a semiconductor integrated circuit device 21 has plural blocks 22 and 23. FIG. 8 shows only the external power wiring for supplying the high potential power supply voltage Vdd to the blocks 22 and 23 from an external terminal 24 of the semiconductor integrated circuit device 21 and for clarify, omits the external power wirings for the low potential power supply voltage Vss. As shown in FIG. 9, the block 22 has power supply terminals T1 and T2 for the high potential power supply voltage Vdd and power supply terminals T3 and T4 for the low power supply voltage Vss. The processing of the block 22 is described below. The block 23 is processed in the same manner as the block 22. In step S11, the CPU 2 samples the width data of the power supply terminals T1, T2, T3, and T4 of the block 22 and the width data of each power supply terminal (not shown) of the block 23.

For example, when the power supply terminals T1 to T4 have the respective predetermined widths (600, 1000, 600, and 600), the CPU 2 calculates the total value of the wiring width and calculates the width ratios of the respective power supply terminals T1 to T4 to the total value. Then, the calculated width ratios of the respective power supply terminals T1 to T4 are set as the current consumption ratios in the respective power supply terminals T1 to T4.

Figure 10:
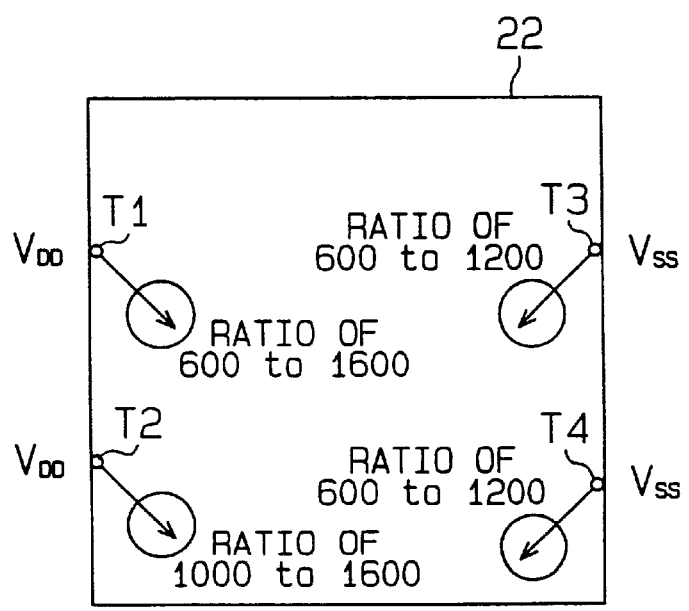
FIG. 10 is a schematic diagram illustrating an intra-block power network.

As shown in FIG. 10, the width ratios 600 to 1600 and 1000 to 1600 are set for the power supply terminals T1 and T2, which receive the power supply terminals T1 and T2 for the high potential power supply voltage Vdd. The width ratios 600 to 1200 and 600 to 1200 of the power supply terminals T3 and T4, which receive the low power supply voltage Vss.

Then, the CPU 2 calculates the current consumption in each power supply terminal using the current consumption ratio (step S3a). For example, assume that the current consumption of the entire block 22 for the high potential power supply voltage VDD is Y and the current consumption of the entire block 22 for the low potential power supply voltage Vss is Z. The CPU 2 multiplies the current consumption ratios (600 to 1600 and 1000 to 1600) in the power supply terminals T1 and T2 by the current consumption Y and calculates the current consumption as {(600/1600)×Y and (1000/1600)×Y} in each of the power supply terminals T1 and T2. Similarly, the CPU 2 multiplies the current consumption ratios (600 to 1200 and 600 to 1200) in each of the power supply terminals T3 and T4 by the current consumption Z and calculates the current consumption as {(600/1200)×Z and (1000/1200)×Z} in each of the power supply terminals T3 and T4.

Subsequently, the CPU 2 analyzes the external power network based on the current consumption in each power supply terminal and calculates the voltage value and current level of each node of the external power network (step S3b).

Figure 11:
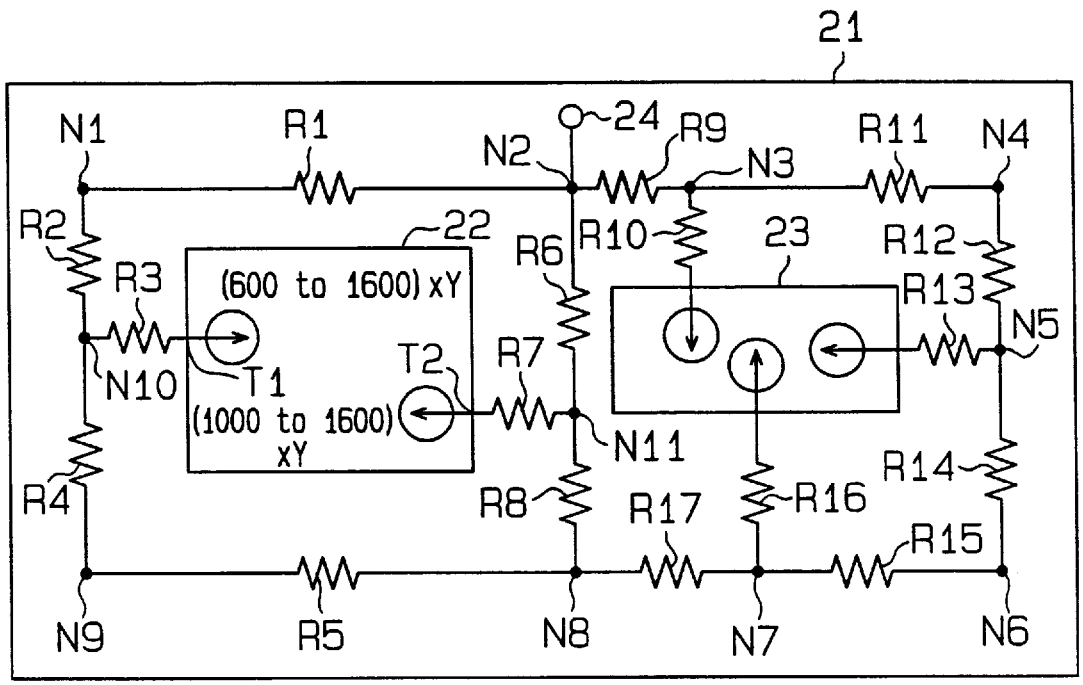
FIG. 11 is a schematic diagram illustrating the external power network of a semiconductor integrated circuit device.

FIG. 11 shows the external power network regarding the high potential power supply generated from the layout data of the semiconductor integrated circuit device 21. The external power network includes plural equivalent resistances R1 to R17 of the external power wiring that supplies the high potential power voltage Vdd to each of the blocks 22 and 23, current sources having the current consumption ((600/1600)×Y and (1,000/1,600)×Y) in the high potential power supply terminals T1 and T2 of the block 22, and current sources having the current consumption in the high potential power supply terminal of the block 23.

The CPU 2 carries out the predetermined matrix operation using the external power network and based on the operation result, calculates the voltage value at nodes N1 to N11 for the equivalent resistances R1 to R17 and the current value applied to each of the plural equivalent resistances R1 to R17. The CPU 2 then obtains the value of the voltage drop in each of the equivalent resistances R1 to R17 (i.e., each part of the external power wiring) from the voltage value in each of the nodes N1 to N11. Further, the CPU 2 obtains the current density in each part of the external power wiring from the value of the current applied to each of the equivalent resistances R1 to R17. The power network of the low potential power supply is processed in the same manner as described above.

Then, the CPU 2, based on the voltage drop value and the current density, determines which portions deviate from a standard value, as incorrect portions (step S4a). The CPU 2, based on the result, changes the partial structure of the incorrect external power wiring (step S4b).

Figure 12:
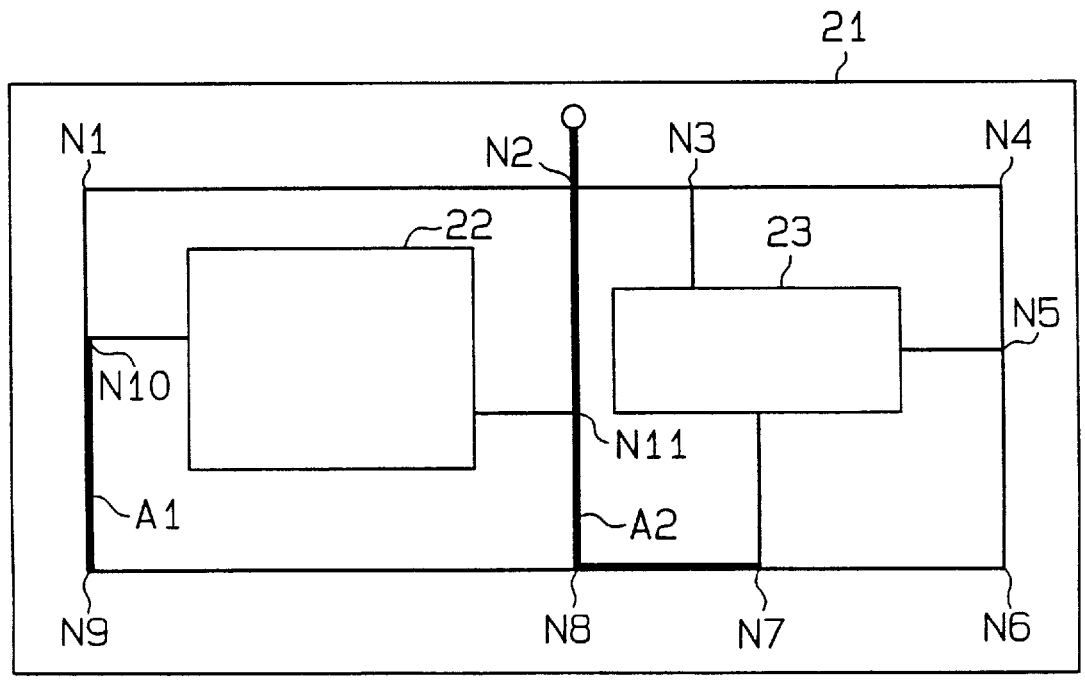
FIG. 12 is a schematic diagram of a semiconductor integrated circuit device in which incorrect portions of an external power wiring are illustrated.

For example, as shown in FIG. 12, when the current density of an external power wiring A1 that corresponds to the equivalent resistance R4 exceeds the standard value, the CPU 2 extends the width of the external power wiring A1 so that the current density of the external power wiring A1 is equal or substantially equal to the standard value.

Further, when the voltage value in the node N7 is lower than the standard value, that is, when the voltage drop value in the path (equivalent resistances R6, R8, and R17) from the external terminal 24 to the node N7 is larger than the standard value, the CPU 2 extends the width of the path (external power wiring A2) from the external terminal 24 to the node N7.

As described above, according to the first embodiment, the current consumption in each power supply terminal is calculated from the power consumption ratio in each power supply terminal of each block and the total current consumption of the entire block. Accordingly, the current consumption in each power supply terminal is quickly obtained without having to perform circuit simulation. Further, because the dispersion of the current consumption in each power supply terminal is considered, the layout of the external power wiring is optimized in accordance with the current consumption of each power supply terminal. As a result, the time required for designing the semiconductor integrated circuit is shortened and the design cost is reduced while maintaining the minimum circuit area.

The external power wiring width is set to the minimum width of the external power wiring in the conventional semiconductor integrated circuit device. Accordingly, if a deviation from the standard value is detected, the width of the external power wiring is altered. This prevents the redundancy of the external power wiring area.

The width ratio of each power supply terminal is set as the current consumption ratio for each power supply terminal by utilizing the fact that the width of each power supply terminal of the block is set in accordance with the current level supplied to the current sources, such as transistors. This allows the current consumption to be obtained quickly and accurately.

(Second Embodiment)

A method and apparatus for generating layout data according to a second embodiment of the present invention are described below with reference to FIGS. 13 to 16. To avoid redundant description, like or same reference numerals are given to those components which are the same as the corresponding components of the first embodiment.

Figure 13:
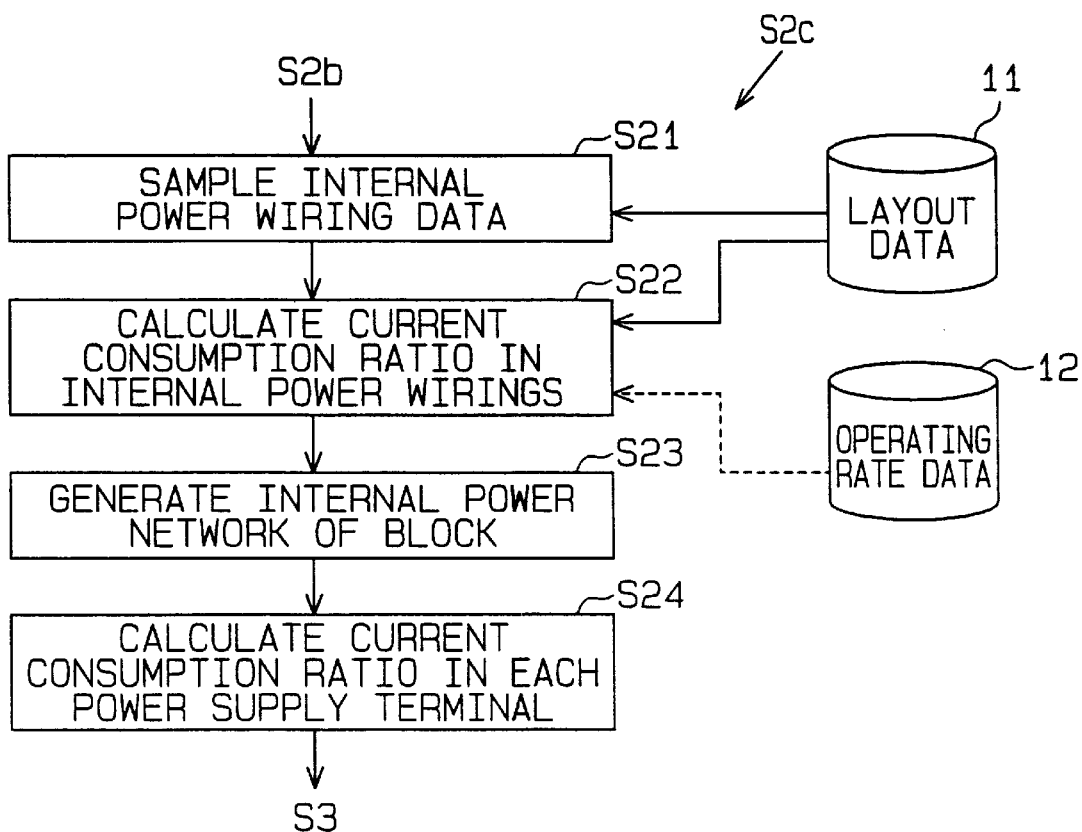
FIG. 13 is a flowchart illustrating the current consumption ratio calculation processing according to a second embodiment of the present invention.
Figure 14:
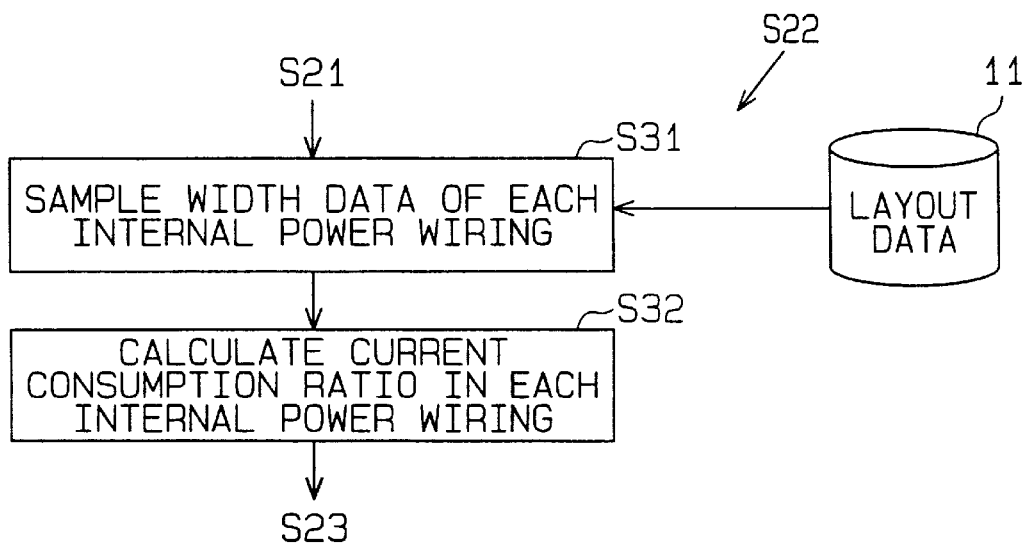
FIG. 14 is a flowchart illustrating the current consumption ratio calculation processing of internal power wirings in the current consumption ratio calculation processing of FIG. 13.

In the second embodiment, steps S11 and S12 of FIG. 7 are replaced with steps S21, S22, S23, and S24 of FIG. 13. FIG. 14 is a flowchart illustrating substeps S31 and S32 of step S22.

In step S21, the CPU 2 samples the data for the internal power wiring of a block from the block layout data stored in the first file 11. The data of the internal power wiring is the data of each internal power wiring extending from each power supply terminal and includes information about the width, length, and area of each internal power wiring.

In step S22, the CPU 2 calculates the current consumption ratio for each power supply terminal using the data of the internal power wiring. Specifically, in step S31, the CPU 2 samples the width data of each internal power wiring from the data of the internal power wirings Then, in step S32, the CPU 2 calculates the width ratio of each internal power wiring for every high potential power supply voltage Vdd and low potential power supply voltage Vss using the width data of each internal power wiring.

Then, in step S23, the CPU 2 generates an internal power network of the block for every high potential power supply Vdd and low potential power supply Vss based on the the data of the internal power wiring and the current consumption ratio of each internal power wiring. In step S24, the CPU 2 carries out the matrix operation for the internal power network and sets the current consumption ratio for each power supply terminal.

Figure 15:
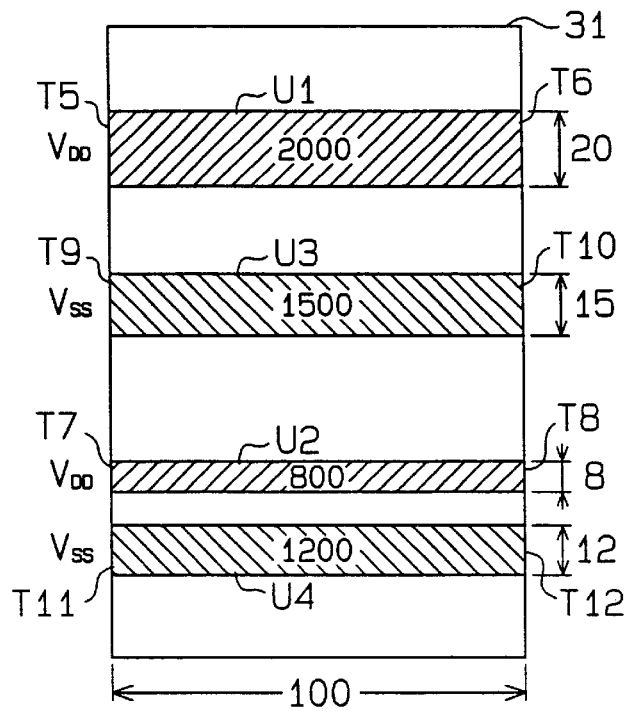
FIG. 15 is a schematic diagram illustrating intra-block internal power wirings.

For example, as shown in FIG. 15, a block 31 includes internal power wirings U1 and U2 for the high potential power supply voltage Vdd and internal power wirings U3 and U4 for the low potential power supply voltage Vss. Both ends of each of the second to fourth internal power wirings U2 to U4 are connected to power supply terminals T7, T8, T9, T10, T11, and T12, respectively. The internal power wirings U1, U2, U3, and U4 have the same length (100) and have predetermined widths (20, 8, 15, and 12).

Figure 16:
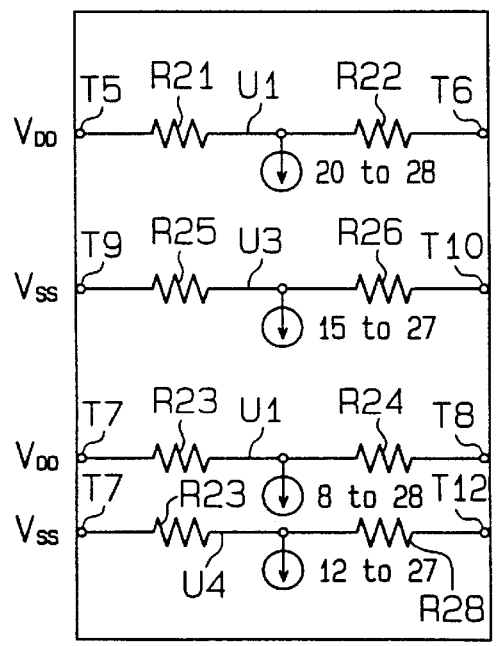
FIG. 16 is a schematic diagram illustrating an intra-block internal power network.

The CPU 2 samples the width data (20, 8, 15, and 12) of the internal power wirings U1, U2, U3, and U4 and calculates the sum total (28 and 27) of the width for each of the power systems Vdd and Vss (step S31). Subsequently, the CPU 2, as shown in FIG. 16, calculates the width ratios (20 to 28, 8 to 28, 15 to 27, and 12 to 27) of the respective internal power wirings U1, U2, U3, and U4 for the sum total of the width. The width ratio of each internal power wiring is set as the current consumption ratio of each internal power wiring.

Using the widths (20 and 8) and length (100) of the internal power wirings U1 and U2, the CPU 2 generates an internal power network that includes equivalent resistances R21 to R24 of the internal power wirings U1 and U2 and current sources having the current values which correspond to the current consumption ratio of the internal power wirings U1 and U2. The equivalent resistances R21 to R24 have resistance values calculated according to the well known resistance network sampling processing based on the widths and lengths of the internal power wirings U1 and U2. In the second embodiment, the internal power network is generated assuming that the current sources having the current consumption ratios 20 to 28 and 8 to 28 are arranged at the center of the internal power wirings U1 and U2. Accordingly, the equivalent resistance R21 and the equivalent resistance R22 have the same resistance value and the equivalent resistance R23 and the equivalent resistance R24 have the same resistance value. To arrange the current sources at the center in this manner results from the fact that the difference of the current consumption in the power supply terminals T5 and T6 is unknown from the width and length of the internal power wiring U1, for example. However, arranging the current sources at the center is desirable because it facilitates the formation of the internal power network in the post-process.

In the same manner as described above, the CPU 2 generates an internal power network that includes equivalent resistances R25 to R28 for the internal power wirings U3 and U4 for the low potential power supply voltage Vss and the current sources having the current values which correspond to the current consumption ratios of the internal power wirings U3 and U4.

Subsequently, the CPU 2 obtains the current consumption ratio for each of the power supply terminals T5 to T12 using the internal power network.

As described above, according to the second embodiment, the CPU 2 generates an internal power network having the equivalent resistances and the current sources set in accordance with the current consumption ratio of internal power wirings. Then, the CPU 2 calculates the current consumption ratio for each power supply terminal using the internal power network. For the current consumption ratio obtained in this manner in each power supply terminal, the equivalent resistances of the internal power wirings are considered. Accordingly, the current consumption in the power supply terminals is very accurate.

Further, utilizing the fact that the width of each internal power wiring is set in accordance with the current level applied thereto, the width ratio of each internal power wiring is set as the current consumption ratio of each internal power wiring. Accordingly, the current consumption is quickly and accurately.

The internal power network of the block 31 is generated assuming that the current sources are connected to the center of the corresponding internal power wirings U1, U2, U3, and U4. In other words, the generation of each power network of the block 31 is facilitated by centering each transistor in the internal power wirings U1, U2, U3, and U4. Accordingly, the power network is quickly generated.

Seven modification examples regarding step S22 are described below.

(First Modification Example)

Figure 17:
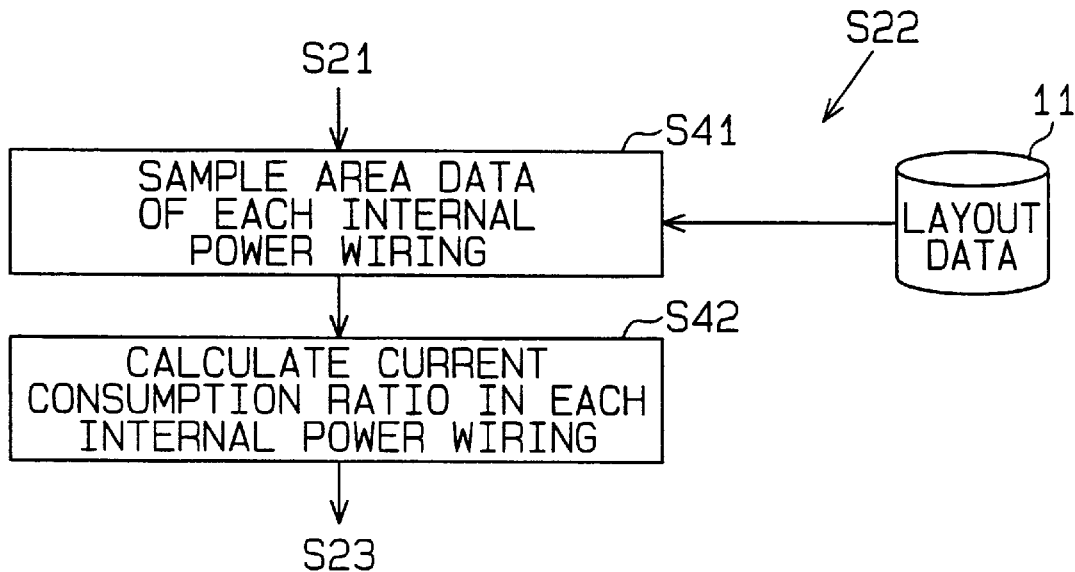
FIG. 17 is flowchart illustrating the current consumption ratio calculation processing according to a first modification example of the second embodiment of the present invention.

In the first modification example, the current consumption ratio of each internal power wiring is set using the area data of each internal power wiring. As shown in FIG. 17, in step S41, the CPU 2 samples the area data of each internal power wiring from the internal power wiring data of the block. In step S42, the CPU 2 calculates the ratio of the area using the area data of each sampled internal power wiring.

For example, in the block 31, the internal power wirings U1 and U2 for the high potential power supply voltage Vdd have the predetermined areas 2000 and 800, respectively. The CPU 2 calculates the area ratios 2000 to 2800 and 800 to 2800 of the internal power wirings U1 and U2 and sets the area ratios as the current consumption ratios in the internal power wirings U1 and U2. Similarly, the CPU 2 samples the areas (1500 and 1200) of the internal power wirings U3 and U4 for the low potential power supply voltage Vss and calculates the ratios (1500 to 2700 and 1200 to 2700) of the areas. Because the area of each internal power wiring is designed according to the current level applied thereto, substantially the exact current consumption ratio of each internal power wiring is obtained.

(Second Modification Example)

Figure 18:
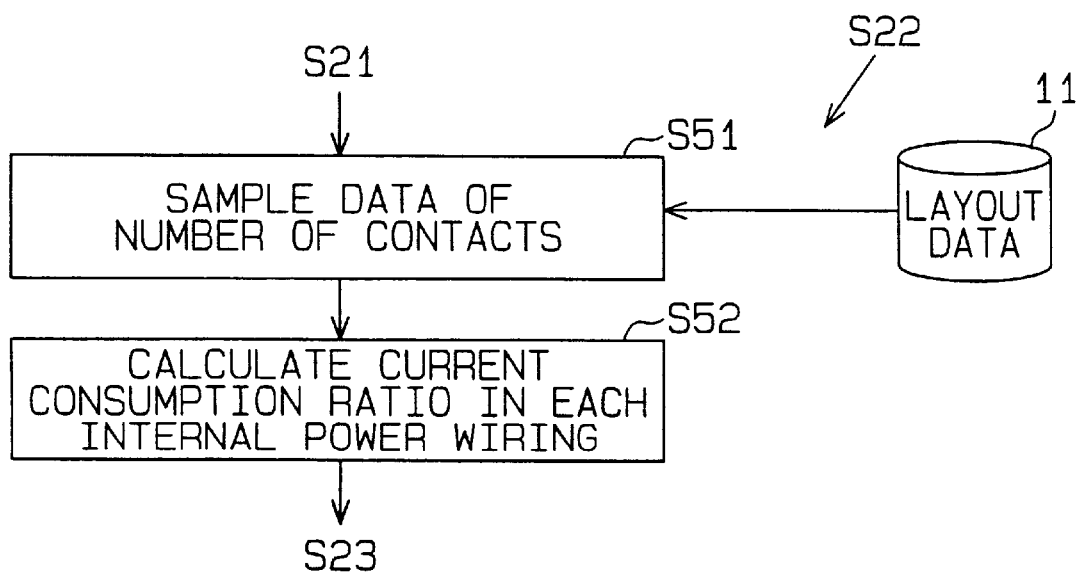
FIG. 18 is a flowchart illustrating the current consumption ratio calculation processing according to a second modification example of the second embodiment of the present invention.

In the second modification example, the current consumption ratio of each internal power wiring is set using the number of contacts for connecting the internal power wiring and transistors. As shown in FIG. 18, in step S51, the CPU 2 samples the data for the number of contacts for connecting the internal power wiring and transistors from the layout data of the block. Then, in step S52, the CPU 2 calculates the ratio of the number of contacts of each internal power wiring for the total number of sampled contacts. The ratio of the number of sampled contacts is set as the current consumption ratio of each internal power wiring.

Figure 19:
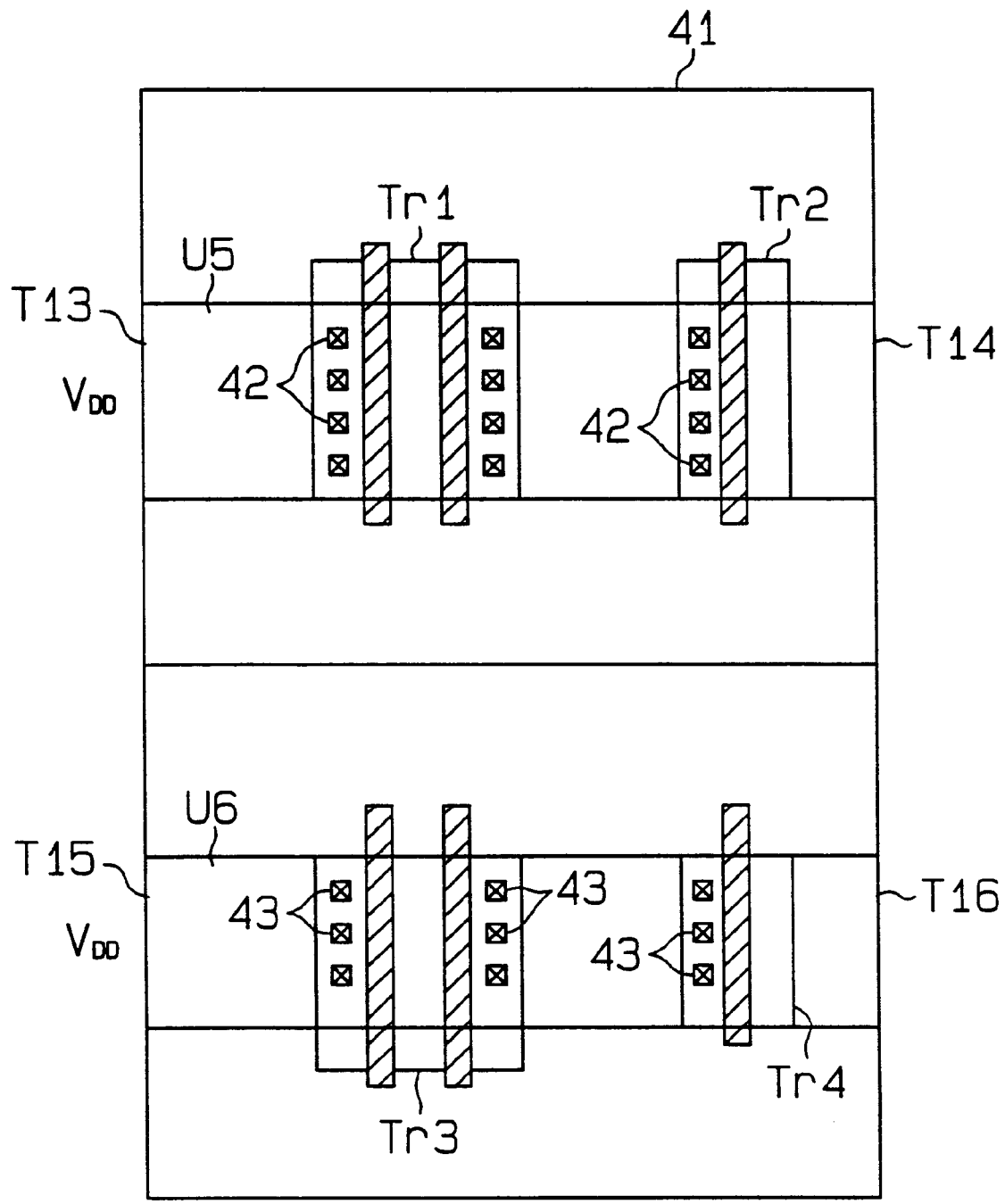
FIG. 19 is a schematic diagram illustrating a block in which transistors are connected to internal power wirings.

For example, as shown in FIG. 19, the block 41 includes the internal power wirings U5 and U6 and MOS transistors Tr1, Tr2, Tr3, and Tr4. Both ends of the internal power wirings U5 and U6 are connected to the power supply terminals T13 to T16 for the high potential power supply voltage Vdd. The internal power wiring U5 is connected to the transistors Tr1 and Tr2 via the predetermined number of contacts 42 (12 contacts in this case). The internal power wiring U6 is connected to the transistors Tr3 and Tr4 via the predetermined number of contacts 43 (9 contacts in this case). The CPU 2 calculates the ratios 12 to 21 and 9 to 21 of the number of contacts 42 and 43 of the internal power wirings U5 and U6 for the total number of contacts (21). Because the number of contacts is set in accordance with the current consumption of the transistors, substantially the exact current consumption ratio of each internal power wiring is obtained.

(Third Modification Example)

Figure 20:
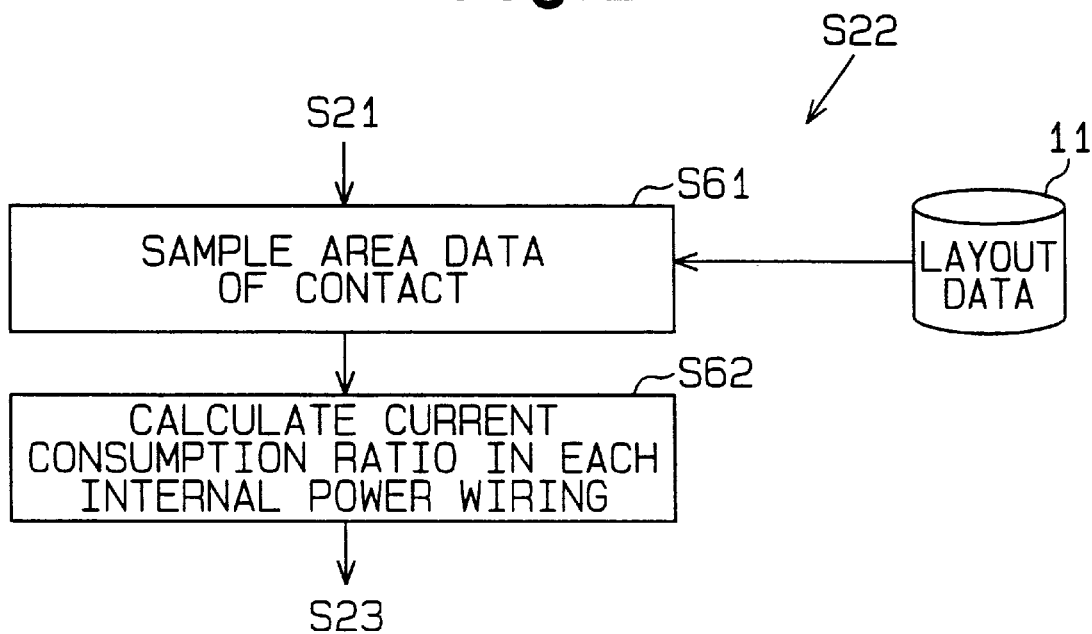
FIG. 20 is a flowchart illustrating the current consumption ratio calculation processing according to a third modification example of the second embodiment of the present invention.

In the third modification example, the current consumption ratio of each internal power wiring is set using the area of the contact that connects the internal power wiring and a transistor. As shown in FIG. 20, in step S61, the CPU 2 samples the area data of the contact from the block layout data. Then, in step S62, the CPU 2 calculates the ratio of the number of contacts of each internal power wiring for the total area of the sampled contact. The ratio of the calculated area is set as the current consumption ratio of each internal power wiring.

For example, as shown in FIG. 19, in the block 41, the CPU 2 samples the total area (P1) of the contacts 42 that connect the internal power wiring U5 and transistors Tr1 and Tr2 and the total area (P2) of the contacts 43 that connect the internal power wiring U6 and the transistors Tr3 and Tr4. The CPU 2 then calculates the ratios P1 to (P1+P2) and P2 to (P1+P2) of each internal power wiring for the total areas (P1+P2) of the contacts 42 and 43. Because the area of the contact is set in accordance with the current consumption of the transistor, substantially the exact current consumption ratio of each internal power wiring is obtained.

(Fourth Modification Example)

Figure 21:
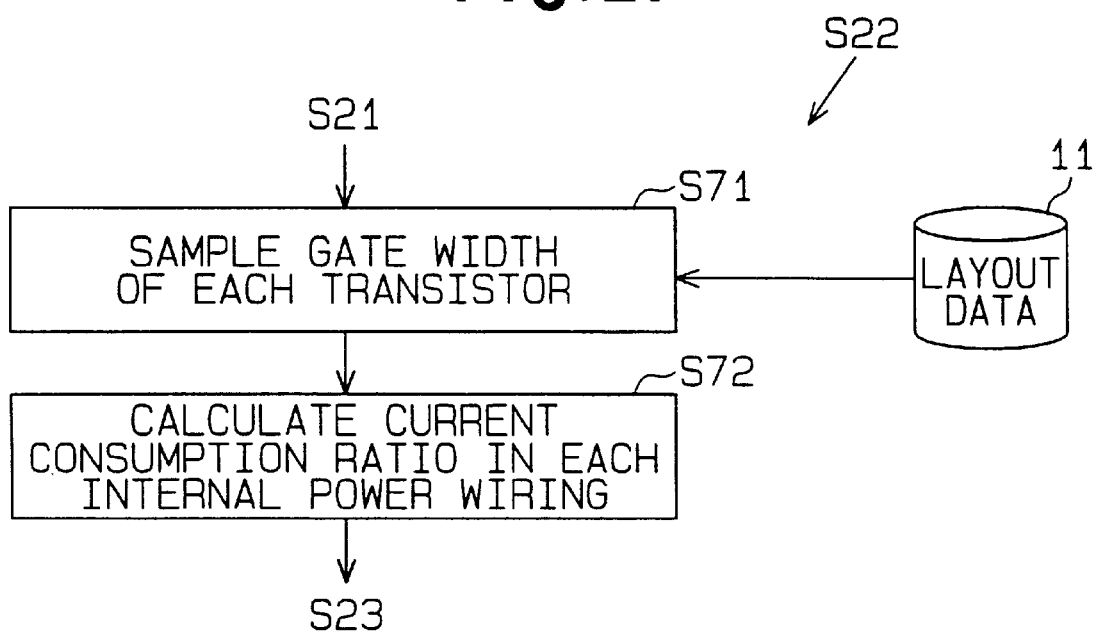
FIG. 21 is a flowchart illustrating the current consumption ratio calculation processing according to a fourth modification example of the second embodiment of the present invention.

In the fourth modification example, the current consumption ratio of each internal power wiring is set using the gate width of the MOS transistor connected to the internal power wiring. As shown in FIG. 21, in step S71, the CPU 2 samples the gate width data of the transistors connected to the internal power wiring from the block layout data. Then, in step S72, the CPU 2 calculates the gate width ratio of each transistor connected to each internal power wiring for the sum total of the gate width of each sampled transistor. The ratio of the sampled width is set as the current consumption ratio of each internal power wiring.

Figure 22:
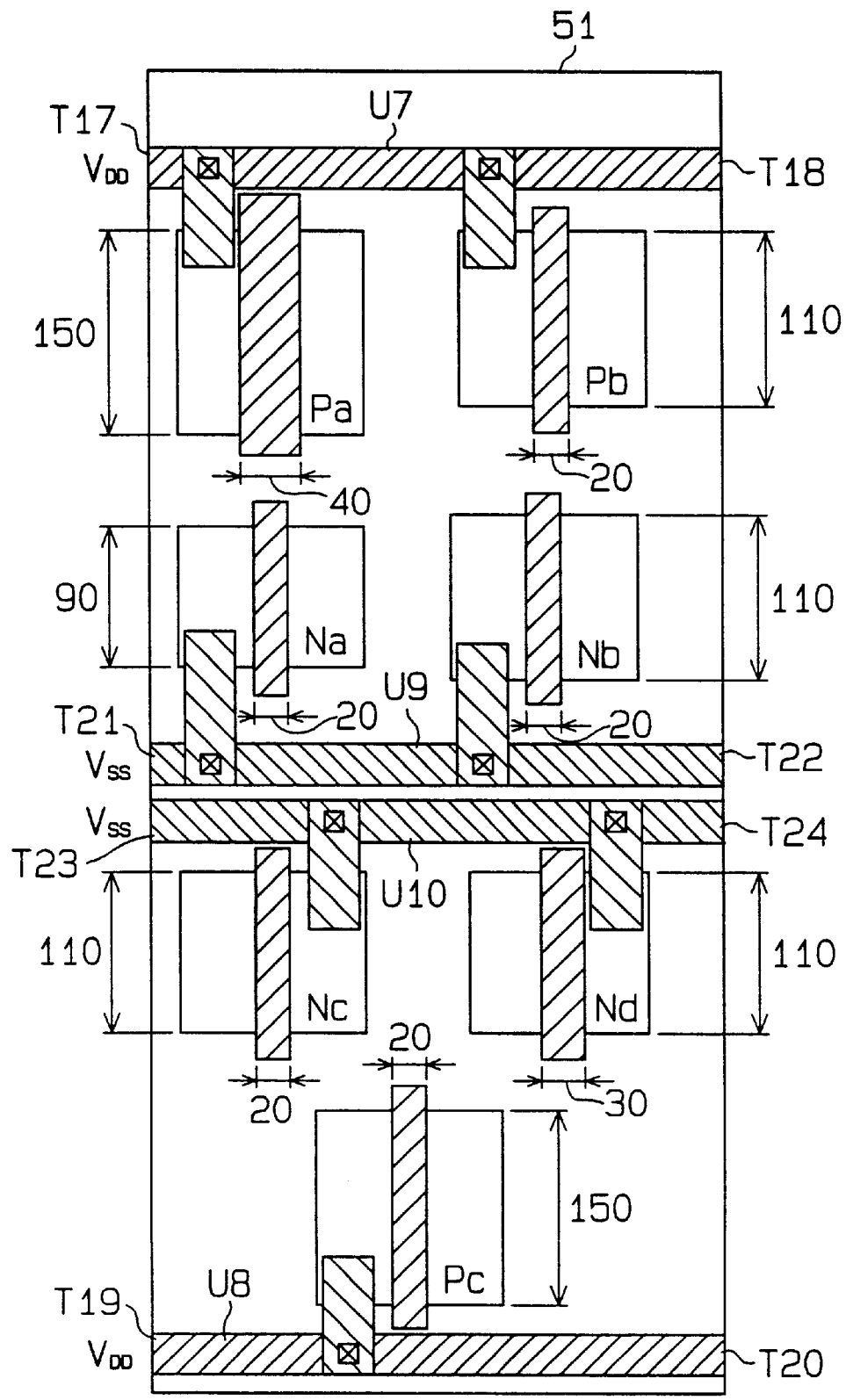
FIG. 22 is a schematic diagram illustrating a block in which transistors having predetermined gate widths and gate lengths are arranged.

For example, as shown in FIG. 22, a block 51 includes P-channel MOS transistors Pa and Pb connected to an internal power wiring U7, a PMOS transistor Pc connected to an internal power wiring U8, N-channel MOS transistors Na and Nb connected to an internal power wiring U9, and NMOS transistors Nc and Nd connected to an internal power wiring U10. Both ends of each of the internal power wirings U7 to U10 are connected to external terminals T17 to T24, respectively. The transistors Pa to Pc and Na to Nd have predetermined gate widths (150, 110, 150, 90, 110, 110, and 110). These gate widths are set in accordance with the current levels applied to the respective transistors Pa to Pc and Na to Nd.

The CPU 2 calculates the gate width ratios (260 to 410 and 150 to 410) of the respective transistors Pa, Pb, and Pc connected to the internal power wirings U7 and U8 for the sum total (410) of the gate widths of the transistors Pa to Pc. Similarly, the CPU 2 calculates the gate width ratios of the respective transistors Na, Nb, Nc, and Nd connected to the internal power wirings U9 and U10 for the sum total of the gate widths of the transistors Na to Nd. Because the gate width of the transistor corresponds to the current consumption of the transistor, a substantially exact current consumption ratio of each internal power wiring is obtained.

(Fifth Modification Example)

Figure 23:
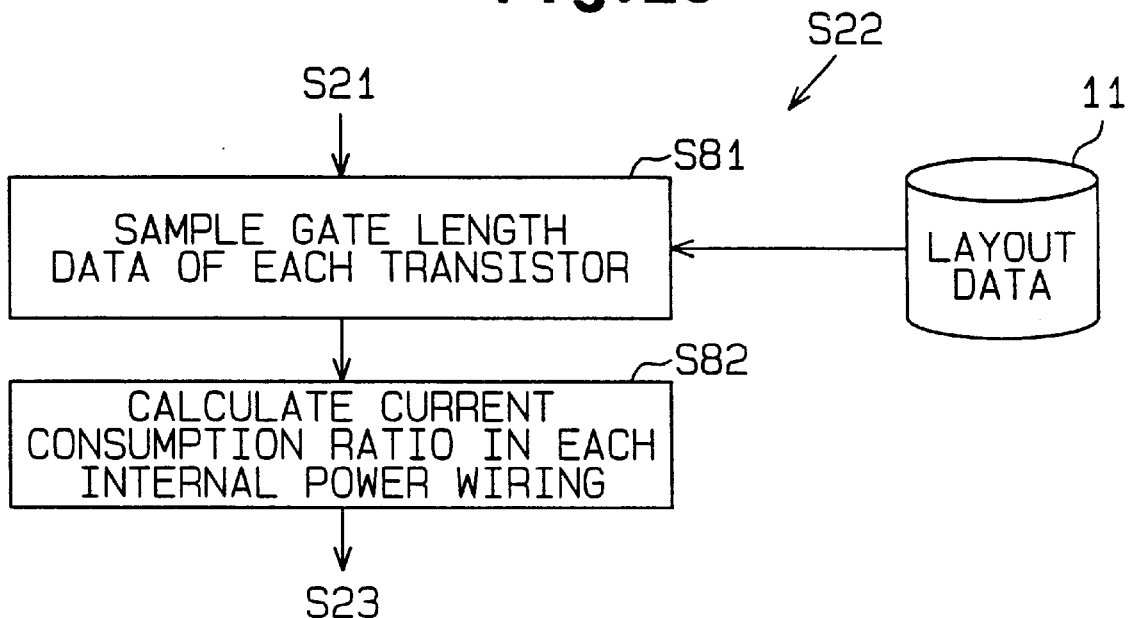
FIG. 23 is a flowchart illustrating the current consumption ratio calculation processing according to a fifth modification example of the second embodiment of the present invention.

In the fifth modification example, the current consumption ratio of each internal power wiring is set using the gate length of the MOS transistors connected to the internal power wiring. As shown in FIG. 23, in step S81, the CPU 2 samples the gate length data of each transistor connected to each internal power wiring from the block layout data. Then, in step S82, the CPU 2 calculates the ratio of the gate length correlation value of each transistor connected to each internal power wiring for the sum total of the gate length correlation values of the sampled transistors. The ratio of the calculated correlation value is set as the current consumption ratio of each internal power wiring. The correlation value is obtained by multiplying the inverse number of the gate length by a predetermined coefficient.

For example, as shown in FIG. 22, the transistor Pa has the predetermined gate length (40), the transistors Pb, Pc, Na, Nb, and Nc have the predetermined gate length (20), and the transistor Nd has the predetermined gate length (30).

The CPU 2 samples the data of these gate lengths and calculates the correlation values (1, 2, and 2) of the transistors Pa, Pb, and Pc using the coefficient (e.g. 40) for the high potential power supply voltage Vdd. The CPU 2 then calculates the ratios (3 to 5 and 2 to 5) of the correlation values of the respective internal power wirings U7 and U8 for the sum total (5) of the correlation values. Similarly, the CPU 2 calculates the relative values (2, 2, 2, and 1.3) of the respective transistors Na, Nb, Nc, and Nd for the system of the low potential power supply voltage Vss and calculates the ratios (4 to 7 and 3.3 to 7.3) of the correlation values of the respective internal power wirings U9 and U10 for the sum total (7.3) of the correlation values. Because the gate length correlation value of the transistor corresponds to the current consumption of the transistor, a substantially exact current consumption ratio of each internal power wiring is obtained.

(Sixth Modification Example)

Figure 24:
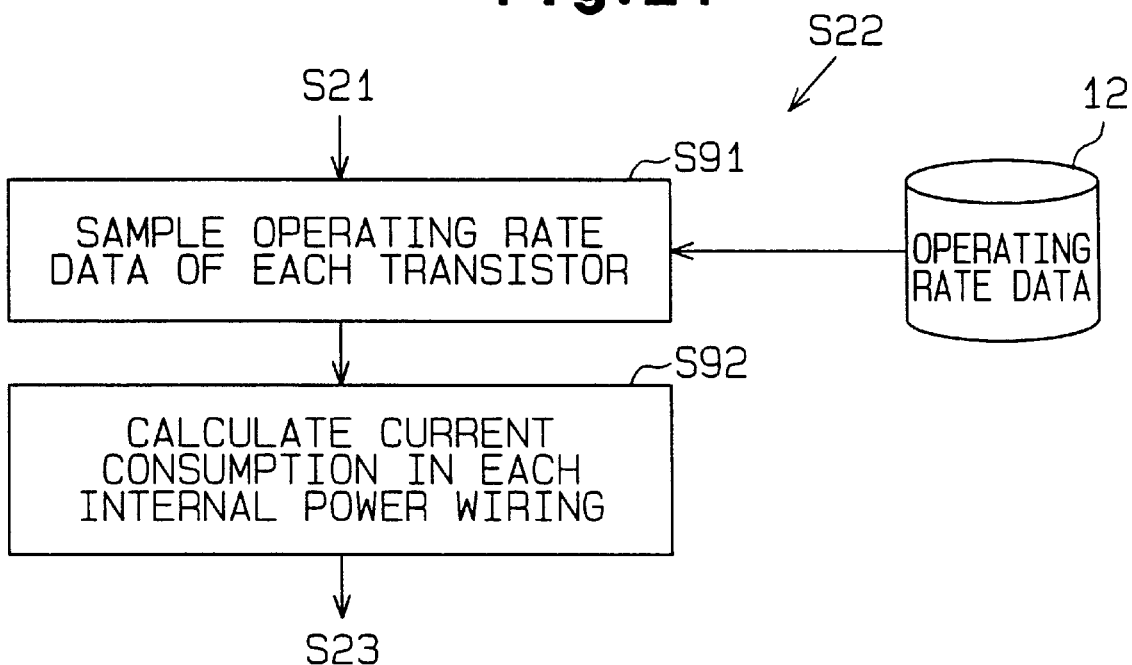
FIG. 24 is a flowchart illustrating the current consumption ratio calculation processing according to a sixth modification example of the second embodiment of the present invention.

In the sixth modification example, the current consumption of each internal power wiring is calculated using the operating rate data of the MOS transistors connected to the internal power wiring. As shown in FIG. 24, in step S91, the CPU 2 samples the operating rate data of the transistor connected to each internal power wiring of the block from the library data stored in the second file 12. Then, in step S92, the CPU 2 calculates the ratio of the operating rate of the MOS transistor connected to each internal power wiring for the sum total of the sampled operating rate. The calculated ratio is set as the current consumption ratio of each internal power wiring. The operating rate data of the transistor is the rate data of the operation time of the transistor in the block and is provided together with the layout data of each block.

For example, as shown in FIG. 22, the transistors Pa, Pb, and Pc connected to the internal power wirings U7 and U8 for the high potential power supply voltage Vdd have the predetermined operating rate (9, 12, and 9). The CPU 2 calculates the ratios (21 to 30 and 9 to 30) of the operating rate of the each transistor for the sum total (30) of the operating rates of the transistors. The transistors Na, Nb, Nc, and Pd connected to the internal power wirings U9 and U10 for the low potential power supply voltage Vss have the predetermined operating rates (3, 8, 0, and 10), respectively. The CPU 2 calculates the ratio (11 to 21, 10 to 21) of the operating rate of each transistor for the sum total (21) of the operating rates of the transistors. Because the operating rate of the transistor corresponds to the current consumption of the transistor, a substantially exact current consumption ratio of each internal power wiring is obtained.

(Seventh Modification Example)

Figures 25, 26:
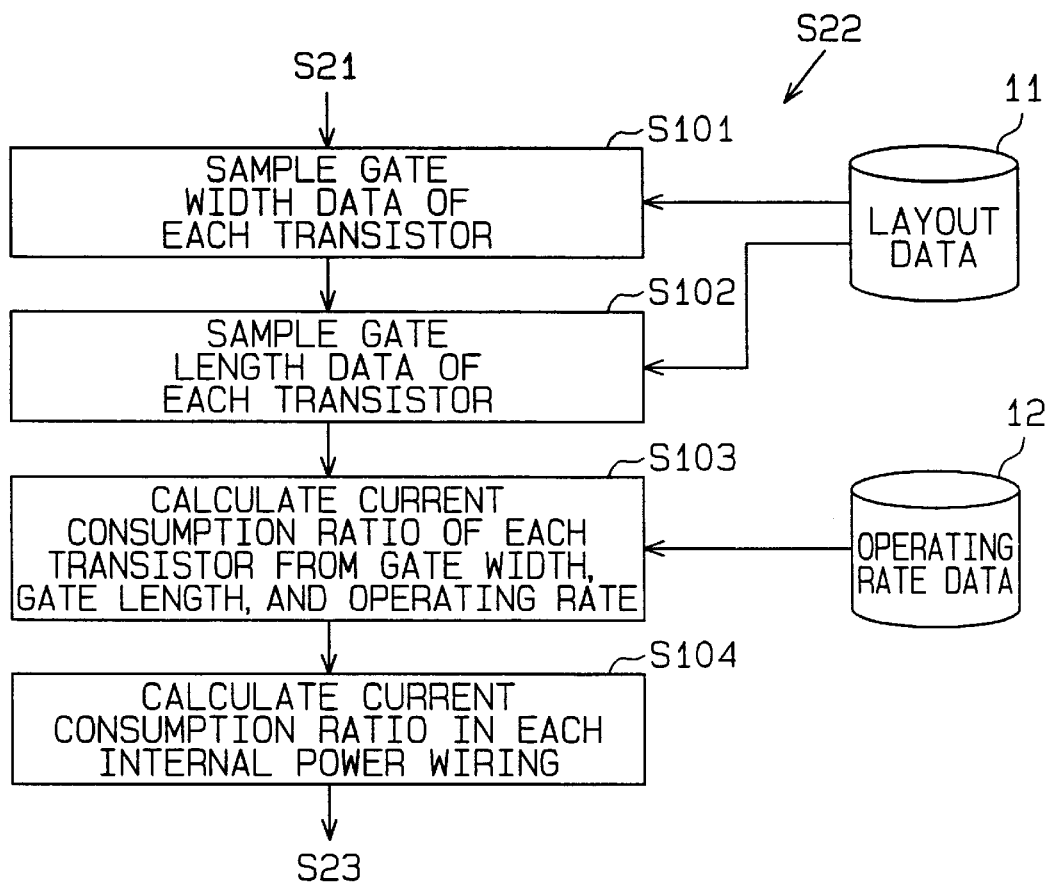
FIG. 25 is a flowchart illustrating the current consumption ratio calculation processing according to a seventh modification example of the second embodiment of the present invention.
FIG. 26 is a table illustrating the values of various data used in the processing of FIG. 25.

In the seventh modification example, the current consumption of each internal power wiring is calculated using the gate length, gate width, and operating rate data of the MOS transistors connected to the internal power wiring. As shown in FIG. 25, in step S101, the CPU 2 samples the gate width data of each transistor connected to each internal power wiring from the block layout data. Then, in step S102, the CPU 2 samples the gate length data of each transistor from the block layout data.

Subsequently, in step S103, the CPU 2 samples the operating rate data of the transistor from the library data stored in the second file 12. The CPU 2 then calculates the current consumption rate of each transistor by multiplying the sampled gate width and gate length correlation values and operating rates for every transistor. Then, in step S104, the CPU calculates the ratio of the current consumption rate of the transistor connected to each internal power wiring for the sum total of the current consumption rate of the transistor. The calculated ratio of the current consumption rate is set as the current consumption ratio of each internal power wiring.

For example, as shown in FIG. 22, the CPU 2 samples the gate widths (150, 110, 150, 90, 110, 110, and 110) and gate lengths (40, 20, 20, 20, 20, 20, and 30) of the transistors Pa to Pc and Na to Nd) (in steps S101 and S102). Then, the CPU 2 calculates the gate length correlation values (1, 2, 2, 2, 2, 2, and 1.3) of the transistors Pa, Pb, Pc, Na, Nb, Nc, and Nd using a predetermined coefficient (40). Further, the CPU 2 samples the operating rates (9, 12, 9, 3, 8, 0, and 10) of the transistors Pa, Pb, Pc, Na, Nb, Nc, and Nd) and calculates the current consumption ratios (1350, 2640, 2700, 540, 1760, 0, and 1430) of the respective transistors Pa, Pb, Pv, Na, Nb, Nc, and Nd (see FIG. 26).

Figure 27:
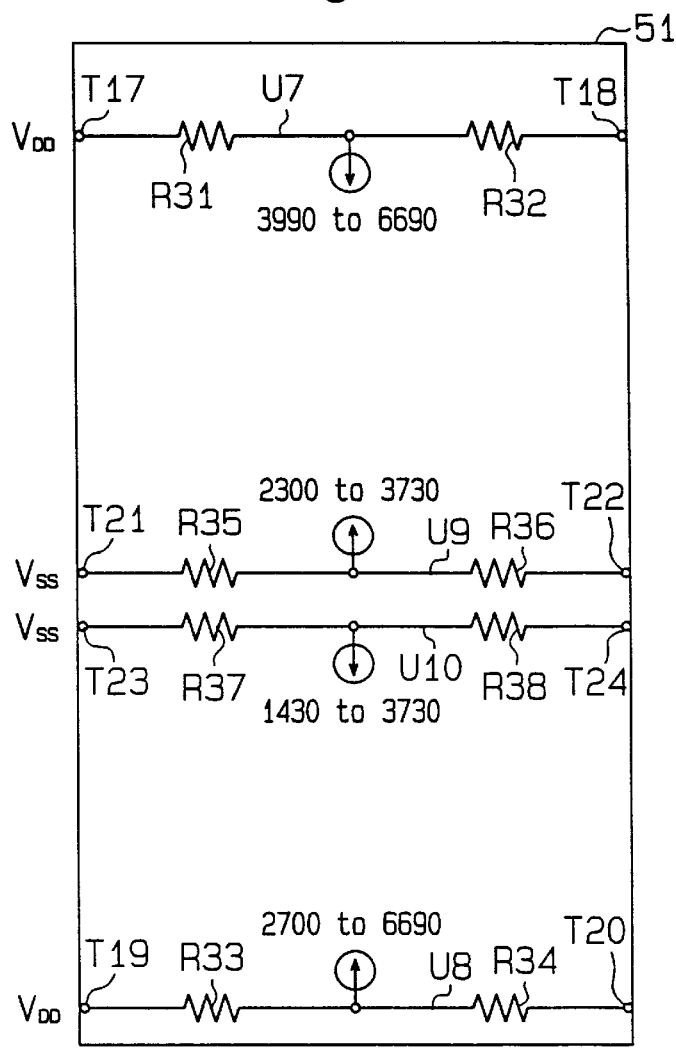
FIG. 27 is a schematic diagram illustrating an intra-block internal power network.

Then, the CPU 2, as shown in FIG. 27, for the high potential power supply voltage Vdd, calculates the ratio (3990 to 6690) of the current consumption rate of each of the transistors Pa and Pb and ratio (2700 to 6690) of the current consumption rate of the transistor Pc connected to the internal power wiring U7 for the sum total (6690) of the current consumption rates of the transistors Pa, Pb, and Pc. Similarly, the CPU 2, for the low potential power supply voltage Vss, calculates the ratio (2700 to 3700) of the current consumption rate of each of the transistors Na and Nb and the ratio (1430 to 3730) of the current consumption rate of each of the transistors Na and Nd connected to the internal power wiring U9. Because the gate width, gate length correlation values of the transistors, and the operating rate of the transistors correspond to the current consumption of the transistors, a substantially exact current consumption ratio of each internal power wiring is obtained.

The internal power network of FIG. 27 includes four current sources having the current consumption ratios (3990 to 6690, 2700 to 6690, 2300 to 3730, and 1430 to 3730) and connected to the center of the internal power wirings U7, U8, U9, and U10, respectively. The equivalent resistance R31 and the equivalent resistance R32 of the internal power wiring U7 have the same resistance value. Each pair of equivalent resistance R33 and equivalent resistance R34, equivalent resistance R35 and equivalent resistance R36, or equivalent resistance R37 and equivalent resistance R38 in the remaining power wirings U8 to U10 have the same resistance value.

The current consumption rate of each transistor is obtained by multiplying at least two of the gate width, gate length correlation value and operating rate. For example, the current consumption rate of each transistor may be obtained by multiplying the gate width and operating rate.

It should be apparent to those skilled in the art that the present invention may be embodied in many other specific forms without departing from the spirit or scope of the invention. Particularly, it should be understood that the invention may be embodied in the following forms.

Figure 28:
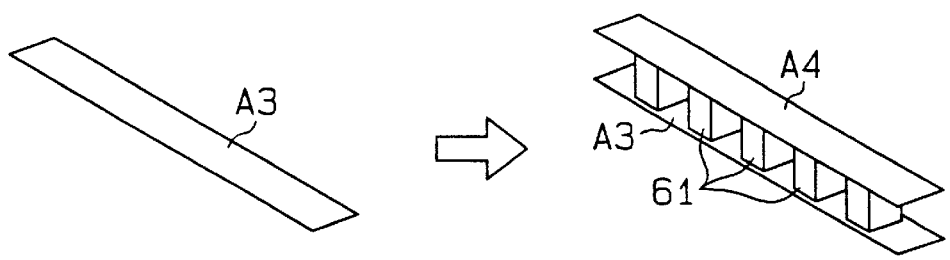
FIG. 28 is a schematic perspective diagram illustrating a modification example of the layer structure of an external power wiring.

In step S4b of the first embodiment, the thickness or layer structure of the power wiring may also be changed instead of changing the width of the external power wiring retrieved as the incorrect portion of a standard value. For example, as shown in FIG. 28, to change the layer structure of the external power wiring, the layer comprising a power wiring A3 and a power wiring A4 connected to the power wiring A3 via contacts 61. The power wiring A4 functions as an enhancing wiring that enhances the current level.

Therefore, the present examples and embodiments are to be considered as illustrative and not restrictive and the invention is not to be limited to the details given herein, but may be modified within the scope and equivalence of the appended claims.

What is claimed is:

1. A method for generating layout data of external power wirings that supply a power supply voltage to a plurality of power supply terminals in each block provided in a semiconductor integrated circuit device, the method comprising the steps of:

acquiring design information of the semiconductor integrated circuit device including external power wiring layout information, block layout information, and block current consumption values;

calculating a current consumption ratio for each power supply terminal of each block using the block layout information;

calculating the current consumption for each power supply terminal using the corresponding calculated current consumption ratio and the block current consumption value;

generating an external power network of the external power wirings using the external power wiring layout information;

analyzing the external power network to calculate voltage and current values for a plurality of parts of the external power wirings; and generating a structure of the external power wirings in accordance with the calculated voltage and current values.

2. The method of claim 1, wherein the block layout information includes power supply terminal width data, and wherein the step of calculating the current consumption ratio for each power supply terminal includes the step of calculating a width ratio of each power supply terminal as the current consumption ratio using the power supply terminal width data.

3. The method of claim 1, wherein the block layout information includes data of internal power wirings connected to the power supply terminals, and wherein the step of calculating the current consumption ratio for each power supply terminal includes the steps of:

calculating a current consumption ratio for each internal power wiring using the block layout information;

generating an internal power network of the internal power wirings using internal power wirings data and the calculated current consumption ratios; and analyzing the internal power network to calculate the current consumption ratio for each power supply terminal.

4. The method of claim 3, wherein the internal power wirings data includes width data of the internal power wirings, and wherein the step of calculating the current consumption ratio for each power wiring includes the step of calculating a width ratio for each internal power wiring as the current consumption ratio, using the width data.

5. The method of claim 3, wherein the internal power wirings data includes area data of the internal power wirings, and wherein the step of calculating the current consumption ratio for each internal power wiring includes the step of calculating an area ratio for each internal power wiring as the current consumption ratio of each internal power wiring.

6. The method of claim 3, wherein the block layout data includes data of the number of contacts for connecting each of the internal power wirings and transistors of the blocks, and wherein the step of calculating the current consumption ratio for each internal power wiring includes the step of calculating a ratio of the number of contacts connected to each internal power wiring as the power consumption ratio for each internal power wiring, using the number of contacts data.

7. The method of claim 3, wherein the block layout data includes area data of contacts that connect each internal power wiring and transistors of the blocks, and wherein the step of calculating the current consumption ratio for each internal power wiring includes the step of calculating an area ratio of the contacts connected to each internal power wiring as the current consumption ratio for each internal power wiring, using the area data of the contacts.

8. The method of claim 3, wherein the block layout data includes gate width data of transistors connected to each internal power wiring, and wherein the step of calculating the current consumption ratio for each internal power wiring comprises the step of calculating a gate width ratio of the transistors connected to each internal power wiring as the current consumption ratio for each internal power wiring, using the gate width data of transistors.

9. The method of claim 3, wherein the block layout data includes gate length data of transistors connected to each internal power wiring, and wherein the step of calculating the current consumption ratio for each internal power wiring includes the steps of:

calculating a gate length correlation value of the transistors connected to each internal power wiring using the gate length data; and calculating the ratio of the gate length correlation value of transistors connected to each internal power wiring as the current consumption ratio for each internal power wiring, using the calculated gate length correlation value.

10. The method of claim 3, further comprising the step of acquiring operating rate data of transistors in each block, and wherein the step of calculating the current consumption ratio for each internal power wiring includes the step of calculating a ratio of the operating rate of the transistors connected to each internal power wiring as the current consumption ratio for each internal power wiring, using the operating rate data of transistors.

11. The method of claim 3, further comprising the step of acquiring operating rate data of transistors in each block, wherein the block layout data includes gate width data and gate length data of transistors connected to each internal power wiring, and wherein the step of calculating the current consumption ratio for each internal power wiring includes the steps of:

calculating a gate length correlation value of the transistors connected to each internal power wiring using the transistor gate length data;

calculating rate data of current consumption of each transistor using at least two of the gate width data of the transistors, the gate length correlation value of the transistors, and the operating rate data of the transistors; and calculating the current consumption ratio of the transistors connected to each internal power wiring using the calculated ratio data.

12. An apparatus for generating layout data of external power wirings that supply a power supply voltage to a plurality of power supply terminals in each block provided in a semiconductor integrated circuit device, the apparatus comprising:

a memory for storing design information of the semiconductor integrated circuit device including external power wiring layout information, block layout information, and block current consumption values; and a processor connected to the memory, for executing layout processing, wherein the processor operates to:

calculate a current consumption ratio for each power supply terminal of each block using the block layout information;

calculate the current consumption for each power supply terminal using the corresponding calculated current consumption ratio and the block current consumption value;

generate an external power network of the external power wirings using the external power wiring layout information;

analyze the external power network to calculate voltage and current values for a plurality of parts of the external power wirings; and generate a structure of the external power wirings in accordance with the calculated voltage and current values.

13. The apparatus of claim 12, wherein the block layout information includes power supply terminal width data, and wherein processor calculates a width ratio of each power supply terminal as the current consumption ratio using the power supply terminal width data.

14. The apparatus of claim 12, wherein the block layout information includes data of internal power wirings connected to the power supply terminals, and wherein the processor calculates a current consumption ratio for each internal power wiring using the block layout information, generates an internal power network of the internal power wirings using internal power wirings data and the calculated current consumption ratios, and analyzes the internal power network to calculate the current consumption ratio for each power supply terminal.

15. The apparatus of claim 14, wherein the internal power wirings data includes width data of the internal power wirings, and wherein the processor calculates a width ratio for each internal power wiring as the current consumption ratio, using the width data.

16. The apparatus of claim 14, wherein the internal power wirings data includes area data of the internal power wirings, and wherein the processor calculates an area ratio for each internal power wiring as the current consumption ratio of each internal power wiring.

17. The apparatus of claim 14, wherein the block layout data includes data of the number of contacts for connecting each of the internal power wirings and transistors of the blocks, and wherein the processor calculates a ratio of the number of contacts connected to each internal power wiring as the power consumption ratio for each internal power wiring, using the number of contacts data.

18. The apparatus of claim 14, wherein the block layout data includes area data of contacts that connect each internal power wiring and transistors of the blocks, and wherein the processor calculates an area ratio of the contacts connected to each internal power wiring as the current consumption ratio for each internal power wiring, using the area data of the contacts.

19. The apparatus of claim 14, wherein the block layout data includes gate width data of transistors connected to each internal power wiring, and wherein the processor calculates a gate width ratio of the transistors connected to each internal power wiring as the current consumption ratio for each internal power wiring, using the gate width data of transistors.

20. The apparatus of claim 14, wherein the block layout data includes gate length data of transistors connected to each internal power wiring, and wherein the processor calculates a gate length correlation value of the transistors connected to each internal power wiring using the gate length data, and calculates the ratio of the gate length correlation value of transistors connected to each internal power wiring as the current consumption ratio for each internal power wiring, using the calculated gate length correlation value.

21. The apparatus of claim 14, wherein the memory stores operating rate data of transistors in each block, and wherein the processor calculates a ratio of the operating rate of the transistors connected to each internal power wiring as the current consumption ratio for each internal power wiring, using the operating rate data of transistors.

22. The apparatus of claim 14, wherein the memory stores operating rate data of transistors in each block, the block layout data includes gate width data and gate length data of transistors connected to each internal power wiring, and wherein the processor calculates a gate length correlation value of the transistors connected to each internal power wiring using the transistor gate length data, calculates rate data of current consumption of each transistor using at least two of the gate width data of the transistors, the gate length correlation value of the transistors, and the operating rate data of the transistors, and calculates the current consumption ratio of the transistors connected to each internal power wiring using the calculated ratio data.

23. A recording medium having recorded thereon computer readable program code for generating layout data of external power wirings that supply a power supply voltage to a plurality of power supply terminals in each block provided in a semiconductor integrated circuit device, the program comprising the steps of:

acquiring design information of the semiconductor integrated circuit device including external power wiring layout information, block layout information, and block current consumption values;

calculating a current consumption ratio for each power supply terminal of each block using the block layout information;

calculating the current consumption for each power supply terminal using the corresponding calculated current consumption ratio and the block current consumption value;

generating an external power network of the external power wirings using the external power wiring layout information;

analyzing the external power network to calculate voltage and current values for a plurality of parts of the external power wirings; and generating a structure of the external power wirings in accordance with the calculated voltage and current values.

24. The recording medium of claim 23, wherein the block layout information includes power supply terminal width data, and wherein the step of calculating the current consumption ratio for each power supply terminal includes the step of calculating a width ratio of each power supply terminal as the current consumption ratio using the power supply terminal width data.

25. The recording medium of claim 23, wherein the block layout information includes data of internal power wirings connected to the power supply terminals, and wherein the step of calculating the current consumption ratio for each power supply terminal includes the steps of:

calculating a current consumption ratio for each internal power wiring using the block layout information;

generating an internal power network of the internal power wirings using internal power wirings data and the calculated current consumption ratios; and analyzing the internal power network to calculate the current consumption ratio for each power supply terminal.

26. The recording medium of claim 25, wherein the internal power wirings data includes width data of the internal power wirings, and wherein the step of calculating the current consumption ratio for each power wiring includes the step of calculating a width ratio for each internal power wiring as the current consumption ratio, using the width data.

27. The recording medium of claim 25, wherein the internal power wirings data includes area data of the internal power wirings, and wherein the step of calculating the current consumption ratio for each internal power wiring includes the step of calculating an area ratio for each internal power wiring as the current consumption ratio of each internal power wiring.

28. The recording medium of claim 25, wherein the block layout data includes data of the number of contacts for connecting each of the internal power wirings and transistors of the blocks, and wherein the step of calculating the current consumption ratio for each internal power wiring includes the step of calculating a ratio of the number of contacts connected to each internal power wiring as the power consumption ratio for each internal power wiring, using the number of contacts data.

29. The recording medium of claim 25, wherein the block layout data includes area data of contacts that connect each internal power wiring and transistors of the blocks, and wherein the step of calculating the current consumption ratio for each internal power wiring includes the step of calculating an area ratio of the contacts connected to each internal power wiring as the current consumption ratio for each internal power wiring, using the area data of the contacts.

30. The recording medium of claim 25, wherein the block layout data includes gate width data of transistors connected to each internal power wiring, and wherein the step of calculating the current consumption ratio for each internal power wiring comprises the step of calculating a gate width ratio of the transistors connected to each internal power wiring as the current consumption ratio for each internal power wiring, using the gate width data of transistors.

31. The recording medium of claim 25, wherein the block layout data includes gate length data of transistors connected to each internal power wiring, and wherein the step of calculating the current consumption ratio for each internal power wiring includes the steps of:

calculating a gate length correlation value of the transistors connected to each internal power wiring using the gate length data; and calculating the ratio of the gate length correlation value of transistors connected to each internal power wiring as the current consumption ratio for each internal power wiring, using the calculated gate length correlation value.

32. The recording medium of claim 25, wherein the program further comprises the step of acquiring operating rate data of transistors in each block, and wherein the step of calculating the current consumption ratio for each internal power wiring includes the step of calculating a ratio of the operating rate of the transistors connected to each internal power wiring as the current consumption ratio for each internal power wiring, using the operating rate data of transistors.

33. The recording medium of claim 25, wherein the program further comprises the step of acquiring operating rate data of transistors in each block, wherein the block layout data includes gate width data and gate length data of transistors connected to each internal power wiring, and wherein the step of calculating the current consumption ratio for each internal power wiring includes the steps of:

calculating a gate length correlation value of the transistors connected to each internal power wiring using the transistor gate length data;

calculating rate data of current consumption of each transistor using at least two of the gate width data of the transistors, the gate length correlation value of the transistors, and the operating rate data of the transistors; and calculating the current consumption ratio of the transistors connected to each internal power wiring using the calculated ratio data.

* * * * *